United States Patent
Ohmi et al.

[11] Patent Number: 6,150,851
[45] Date of Patent: Nov. 21, 2000

[54] CHARGE TRANSFER AMPLIFIER CIRCUIT, VOLTAGE COMPARATOR, AND SENSE AMPLIFIER

[75] Inventors: Tadahiro Ohmi, 1-17-301, Komegabukuro 2 chome, Aoba-ku, Sendai-shi, Miyagi-ken, 980-0813; Takahisa Nitta, Tokyo; Koji Kotani, Miyagi-ken, all of Japan

[73] Assignees: Tadahiro Ohmi, Miyagi-ken; Kabushiki Kaisha Ultraclean Technology Research Institute, Tokyo, both of Japan

[21] Appl. No.: 09/092,465

[22] Filed: Jun. 5, 1998

[30] Foreign Application Priority Data

| Jun. 6, 1997 | [JP] | Japan | 9-149631 |
| Nov. 6, 1997 | [JP] | Japan | 9-304598 |
| Jun. 5, 1998 | [JP] | Japan | 10-157366 |

[51] Int. Cl.⁷ ............................................. G11C 27/02
[52] U.S. Cl. ....................... 327/91; 327/77; 327/337
[58] Field of Search ........................ 327/91, 94, 95, 327/96, 77, 337; 330/9, 51

[56] References Cited

U.S. PATENT DOCUMENTS

| 3,852,619 | 12/1974 | Carbrey | 327/94 |
| 5,410,195 | 4/1995 | Ichihara | 327/10 |
| 5,659,497 | 8/1997 | Ueno et al. | 365/149 |

FOREIGN PATENT DOCUMENTS

| 60-68654 | 4/1985 | Japan | H01L 29/78 |
| 3-6679 | 1/1991 | Japan | G06G 7/60 |
| 5-335506 | 12/1993 | Japan | H01L 27/10 |
| 5-335656 | 12/1993 | Japan | H01L 19/00 |
| 6-53431 | 2/1994 | Japan | H01L 27/10 |
| 6-77427 | 3/1994 | Japan | H01L 27/10 |
| 6-112427 | 4/1994 | Japan | H01L 27/10 |
| 6-125049 | 5/1994 | Japan | H01L 27/10 |
| 6-139377 | 5/1994 | Japan | G06G 7/12 |
| 6-139380 | 5/1994 | Japan | G06G 7/60 |
| 6-244375 | 9/1994 | Japan | H01L 27/10 |
| 6-250994 | 9/1994 | Japan | G06F 15/18 |
| 6-252744 | 9/1994 | Japan | H03K 19/0952 |
| 07153924 | 6/1995 | Japan | H01L 27/10 |
| 07161942 | 6/1995 | Japan | H01L 27/10 |
| 07200513 | 8/1995 | Japan | G06F 15/18 |
| 07211084 | 8/1995 | Japan | G11C 11/56 |
| 07226085 | 8/1995 | Japan | G11C 11/56 |
| 07226912 | 8/1995 | Japan | H04N 5/907 |
| 08084062 | 3/1996 | Japan | H03K 19/0175 |
| 08195091 | 7/1996 | Japan | G11C 16/06 |
| 08221504 | 8/1996 | Japan | G06G 7/60 |
| 08274197 | 10/1996 | Japan | H01L 21/8247 |
| 09244875 | 9/1997 | Japan | G06F 7/50 |
| 09245110 | 9/1997 | Japan | G06G 7/60 |

(List continued on next page.)

*Primary Examiner*—Toan Tran
*Attorney, Agent, or Firm*—Randall J. Knuth

[57] ABSTRACT

Charge transfer amplifier circuit which is capable of canceling fluctuations in the element characteristics thereof and which conducts highly accurate voltage amplification without the use of a stationary current, and provides a voltage comparator which may be applied to a highly accurate A/D converter which has low power consumption. The charge transfer amplifier circuit is provided with a MOS transistor, a first capacity and a second capacity which are effectively connected to, respectively, the source electrode and the drain electrode of the MOS transistor, a mechanism for setting the region between the terminals of the first capacity and the region between the terminals of the second capacity, respectively, to appropriate predetermined potential differences, and for releasing these, and a mechanism for appropriately externally altering the potential difference between the gate and the source of the MOS transistor. The first capacity is set so as to be larger than the second capacity. Furthermore, in the voltage comparator, a dynamic latch circuit is connected to the drain electrode of the charge transfer amplifier circuit.

16 Claims, 15 Drawing Sheets

FOREIGN PATENT DOCUMENTS

| | | | |
|---|---|---|---|
| PCT/JP90/00582 | 5/1990 | WIPO | H01L 21/316 |
| PCT/JP92/00347 | 3/1992 | WIPO | H01L 29/788 |
| PCT/JP93/00750 | 6/1993 | WIPO | H01L 27/10 |
| PCT/JP94/00073 | 1/1994 | WIPO | G03K 19/094 |
| PCT/JP94/00217 | 2/1994 | WIPO | G11C 11/56 |
| PCT/JP96/00771 | 3/1996 | WIPO | G06G 7/60 |
| PCT/JP96/00882 | 4/1996 | WIPO | G06G 7/12 |
| PCT/JP96/00884 | 4/1996 | WIPO | H01L 29/788 |
| PCT/JP96/00885 | 4/1996 | WIPO | G06G 7/12 |

CHARGE TRANSFER AMPLIFIER CIRCUIT, VOLTAGE COMPARATOR, AND SENSE AMPLIFIER

BACKGROUND OF THE INVENTION

1. Field of the Invention

The present invention relates to a charge transfer amplifier circuit capable of highly precise amplification, to a voltage comparator, and to a sense amplifier.

2. Description of the Related Art

A/D converters, which are circuits which convert analog signals into digital signals, are extremely important circuits which are necessary as interfaces connecting the real world, in which all values comprise analog signals, with the computer world, in which digital values are employed. In particular, in recent years, data terminals have been reduced in size and become portable, and there have been strong demands for a reduction in the amount of power consumed by the A/D converters.

Standard A/D converters employ either a chopper type CMOS inverter or a differential amplifier as the comparator, and since a stationary direct electrical current (the auto zero current in the chopper and the bias current in the differential amplifier) flows in such devices, the power consumption increases.

In order to effect a reduction in power consumption, A/D converters have been developed which employ dynamic latch (sense amplifier) voltage comparator circuits (see FIG. 17), which do not involve stationary power consumption.

However, these dynamic latch circuits do not have mechanisms for canceling fluctuations in the element characteristics, such as the threshold value and the like, so that when used as comparators, variations in the offset voltage are produced, the comparison accuracy is poor, and such devices are not applicable as highly accurate A/D converters.

SUMMARY OF THE INVENTION

The present invention has an object thereof to provide a highly accurate A/D converter which consumes little power and which realizes a semiconductor circuit which cancels fluctuations in element characteristics, and which conducts voltage amplification without a stationary current, and which effectively reduces the variations in the offset voltage of a dynamic latch circuit.

Furthermore, the present invention has an object thereof to provide a voltage comparator for use in highly accurate A/D converters having low power consumption, which allows the realization of a voltage amplifier circuit which is capable of high speed operations and has a large amplification factor, and has little power consumption.

The charge transfer amplifier circuit of the present invention is provided with: an MOS transistor, a first capacity and a second capacity which are effectively coupled to the source electrode and drain electrode, respectively, of the MOS transistor, a mechanism for setting the region between the two terminals of the first capacity and the region between the two terminals of the second capacity to an appropriate predetermined potential difference, and for releasing this, and a mechanism for appropriately externally altering the potential difference between the gate and source of the MOS transistor; the first capacity is set so as to be larger than the second capacity.

Another charge transfer amplifier circuit of the present invention comprises: a first circuit, which is provided with a PMOS transistor, a first capacity which is effectively coupled with the source electrode of the PMOS transistor, a mechanism for setting the region between both terminals of the first capacity to an appropriate predetermined potential difference, and releasing this, and a mechanism for appropriately externally altering the potential difference between the gate and the source of the PMOS transistor; and a second circuit, which is provided with an NMOS transistor, a first capacity which is effectively coupled with the source electrode of the NMOS transistor, a mechanism for setting the region between the terminals of the first capacity to an appropriate predetermined potential difference and releasing this, and a mechanism for appropriately externally altering the potential difference between the gate and the source of the NMOS transistor; where the first circuit and the second circuit are connected at the drain electrodes of the PMOS transistor and the NMOS transistor, a mechanism is provided for setting the region between the terminals of a second capacity which is effectively connected with these drain electrodes to an appropriate predetermined potential difference, and releasing this, and all of the first capacities in the first circuit and the second circuit are set so as to be larger than the second capacity.

In the voltage comparator of the present invention, a dynamic latch circuit is connected to the drain electrodes of the charge transfer amplifier circuit of the present invention described above.

The charge transfer positive feedback amplifier circuit of the present invention is provided with:

a first MOS transistor;

a second MOS transistor of an opposite conductivity type to the first MOS transistor;

a storage capacity which is connected between the source electrode of the first MOS transistor and the source electrode of the second MOS transistor;

a mechanism for setting the two terminals of the storage capacity to, respectively, appropriate predetermined potentials during a reset period;

a mechanism for connecting the gate electrode of the second MOS transistor with the drain electrode of the first MOS transistor, a mechanism for setting the drain electrode of the first MOS transistor to an appropriate predetermined potential in the precharge period following the reset period, and for releasing this potential in an amplification period following the precharge period; and/or a mechanism for connecting the gate electrode of the first MOS transistor with the drain electrode of the second MOS transistor, and a mechanism for setting the drain electrode of the second MOS transistor to an appropriate predetermined potential during the precharge period and releasing this potential during the amplification period; and a mechanism for altering the gate/source voltage of the first MOS transistor and/or the gate/source voltage of the second MOS transistor, in response to an inputted signal, the voltage of which changes during the amplification period.

In the charge transfer positive feedback amplifier circuit of the present invention, the voltage comparator of the present invention has as the output thereof at least one junction at which is provided a mechanism for setting an appropriate predetermined potential in the precharge period and for releasing this potential in the amplification period, and a latch circuit is connected to this junction either directly or via a capacity.

Furthermore, in the sense amplifier of the present invention, a bit line to which a plurality of memory elements are connected is connected to the input of the charge transfer positive feedback amplifier circuit of the present invention.

In the present invention, voltage amplification is made possible by the charge transfer principle without the use of a direct current. Furthermore, the operational characteristics of the device are unlikely to be affected by fluctuations in the element characteristics. By means of positioning at the prestage of a dynamic latch circuit, it is possible to effectively reduce the variation in the offset voltage of the dynamic latch circuit, and to realize a highly accurate comparator which consumes little power. If this is applied to an A/D converter, it is possible to realize a highly accurate low power A/D converter.

In the present invention, by means of the charge transfer mechanism employing a source follower and by means of the positive feedback mechanism, high speed voltage amplification with a large amplification factor becomes possible. Voltage amplification is possible without the use of the direct current, and furthermore, the operational characteristics are unlikely to be affected by fluctuations in the element characteristics.

By means of positioning the charge transfer positive feedback amplifier circuit of the present invention at the prestage of a dynamic latch circuit, it is possible to effectively reduce variations in the offset voltage of the dynamic latch circuit, and it is possible to realize a voltage comparator which is highly accurate and has low power consumption.

Furthermore, if this device is applied to an A/D converter, it is possible to realize a highly accurate low power A/D converter. Furthermore, if this device is applied to a sense amplifier of a memory circuit, it is possible to realize a high speed sense amplifier which is highly accurate and has low power consumption.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE INVENTION

Description of the References

Figure 1:
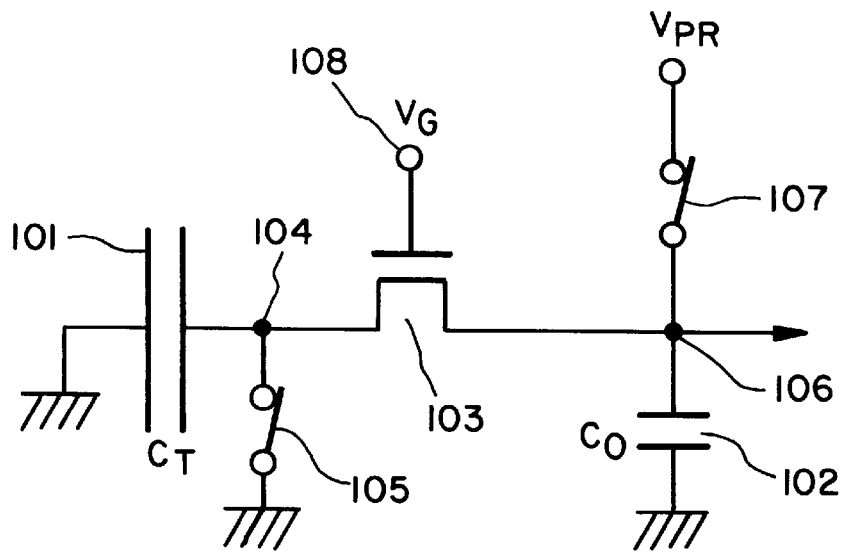
FIG. 1 is a structural diagram showing a charge transfer amplifier circuit in accordance with embodiment 1.

| | | | |
|---|---|---|---|
| 101 | storage capacity (first capacity) | 907, 911 | reset switches |
| | | 908 | P type MOS transistor |
| 102 | output capacity (second capacity) | 912, 913 | precharge switches |
| | | 1001 | storage capacity |
| 103 | N type MOS transistor | 1002 | output capacity |
| 104 | junction | 1003 | N type MOS transistor |
| 105 | switch for resetting the storage capacity | 1004, 1010 | connecting switches |
| 106 | output junction | 1005, 1008 | junctions |
| 107 | precharge switch | 1006, 1009 | reset switches |
| 108 | input junction | 1007 | P type MOS transistor |
| 201, 202 | storage capacities (first capacities) | 1011 | precharge switch |
| | | 1101 | P type MOS transistor |
| 203 | output capacity (second capacity) | 1102 | N type MOS transistor |
| | | 1103 | first circuit |
| 204 | N type MOS transistor | 1104 | N type MOS transistor |
| 205 | switch | 1105 | P type MOS transistor |
| 206 | junction | 1106 | second circuit 306 |
| 207 | reset switch | 1107 | junction |
| 208 | P type MOS transistor | 1201 | change in input potential |
| 209 | switch | 1202 | change in potential at output junction |
| 210 | junction | | |
| 211 | reset switch | 1301, 1302 | fluctuations in the input offset voltage |
| 212 | output junction | | |
| 213 | precharge switch | 1401 | charge transfer positive feedback amplifier circuit |
| 214 | input junction | | |
| 301 | input junction | | |
| 302 | output junction | 1402, 1403 | input changeover switch |
| 303 | change in current running through N type MOS transistor | | |
| | | 1404 | input sampling capacity |
| | | 1405 | precharge switch |
| 304 | change in current running through P type MOS transistor | 1406 | input terminal |
| | | 1407 | dynamic latch circuit |
| | | 1408, 1410 | N type MOS transistors |
| 501 | CMOS charge transfer amplifier circuit | | |
| | | 1409, 1411 | first P type transistors |
| 502 | first input changeover switch | | |
| | | 1412, 1413 | latch control switches |
| 503 | second input changeover switch | | |
| | | 1414, 1415 | switches |
| 504 | input sampling capacity | 1501 | charge transfer positive feedback amplifier circuit |
| 505 | precharge switch | | |
| 506 | CMOS charge transfer amplifier circuit | | |
| | | 1502 | memory cell of dynamic |

DETAILED DESCRIPTION OF THE INVENTION

Description of the References

| | | | |
|---|---|---|---|
| 507 | dynamic latch circuit | | memory |
| 508 | first N type MOS transistor | 1503 | switch |
| | | 1504 | storage capacity |
| 509 | first P type MOS transistor | 1505 | word line |
| | | 1506 | bit line |
| 510 | second N type MOS transistor | 1507 | precharge switch |
| | | 1508 | latch circuit |
| 511 | second P type MOS transistor | 1601, 1602 | charge transfer positive feedback amplifier circuits |
| 512 | first latch control switch | 1603, 1604 | operational junctions |
| 513 | second latch control switch | 1605 | dynamic latch circuit |
| 514 | control switch | 1606, 1607 | precharge switches |
| 515 | control switch | 1608, 1609, 1611, 1612 | input changeover switches |
| 901 | storage capacity | | |
| 902 | output capacity | | |
| 903 | input capacity | 1610 | first input sampling capacity |
| 904 | N type MOS transistor | | |
| 905, 909 | connecting switches | 1613 | second input sampling capacity |
| 906, 910 | junctions | | |

Hereinbelow, the present invention will be explained in detail based on embodiments; however, it is of course the case that the present invention is in no way limited to the embodiments descried.

FIG. 1 is a schematic diagram of a circuit showing a first embodiment of the present invention. This circuit is a charge transfer amplifier circuit employing a N type MOS transistor. In the figure, reference 101 indicates a storage capacity (first capacity) having a capacity of $C_T$, and reference 102 indicates an output capacity (second capacity) having a capacity of $C_O$. No capacity is actually provided for output capacity 102; rather, the input capacity of the following stage circuit functions equivalently as the output capacity of the present circuit. Reference 103 indicates a N type MOS transistor; the source electrode thereof is junction 104, and this is connected with storage capacity 101 and the reset switch 105 of storage capacity 101. The drain electrode of N type transistor 103 is output junction 106, and this is connected with output capacity 102 and a precharge switch 107. Connected with output capacity 102 and a precharge switch 107. The gate electrode of N type transistor 103 is formed by input junction 108.

This circuit functions in three stages. The first stage is the reset stage; the resetting of storage capacity 101 is conducted. Switch 105 is placed in the ON position, junction 104 is grounded, and the storage capacity 101 is reset. In other words, the storage capacity 101 is discharged.

The second stage is the precharge stage. Switch 105 is placed in the OFF position, and switch 107 is placed in the ON position. The gate electrode of N type MOS transistor 103, that is to say, the input junction 108 of the circuit, has a voltage $V_G$ applied thereto. At this time, the output capacity 102 is precharged at a precharged voltage of $V_{PR}$ and a current flows through N type transistor 103, so that the charging (precharging) of storage capacity 101 is initiated. Eventually, the potential of junction 104 rises, and when the potential difference between the gate and the source of N type MOS transistor 103 becomes equal to the threshold value $V_{TH}$ of the N type MOS transistor 103, the N type MOS transistor 103 enters an OFF state, the current ceases to flow, and the precharging of storage capacity 101 is automatically terminated. At this time, the potential of the junction 104 comprising the source electrode of N type MOS transistor 103 has a value of $V_G - V_{TH}$.

The third stage is the amplification stage. Switch 107 is place in an OFF state. Switch 105 remains in the OFF position. At this time, the potential of the gate electrode of N type MOS transistor 103, that is to say, the input junction 108 of the circuit, is amplified from a level of $V_G$ by $\Delta V_G$, and becomes $V_G + \Delta V_G$. When this occurs, the voltage difference between the gate and the source of N type MOS transistor 103 exceeds the threshold value $V_{TH}$, so that then type MOS transistor 103 again enters an ON state, and current begins to flow. The current flowing at this time is such that the charge stored in output capacity 102 is transferred. Eventually, when the potential difference between the gate and the source of N type MOS transistor 103 again becomes equal to the threshold value $V_{TH}$ of N type MOS transistor 103, N type MOS transistor 103 again enters an OFF state, and current ceases to flow. At this time, the potential of the junction 104 forming the source electrode of N type MOS transistor 103 has a value of $B_{G-BTH} + \Delta V_G$. In other words, in the same way as the potential change in the gate electrode of N type MOS transistor 103, a change of $\Delta V_G$ is experienced from the precharge stage. At this time, amount of charge transferred from output capacity 102 to storage capacity 101 is $\Delta Q = C_T \cdot \Delta V_G$. Since the charge $\Delta Q = C_T \cdot \Delta V_G$ from the output capacity 102 has decreased, the terminal voltage of the output capacity, that is to say, the potential of output junction 106, changes by $\Delta V_O = -C_T \cdot \Delta V_G / C_O$. In other words, amplification is conducted such that the amplification factor is $-C_T/C_O$.

As is clear from the operation of the circuit, a stationary direct current does not flow in the circuit. It is thus possible to conduct voltage amplification with a low power consumption.

Furthermore, as is clear from the expression of the amplification factor, even if the device parameters of the N type MOS transistor 103, such as the threshold value $V_{TH}$, fluctuate, there is no effect on the amplification function. In other words, a function is provided such that variations in element characteristics are corrected.

In the present embodiment, a N type MOS transistor was employed as the MOS transistor; however, it is of course the case that a P type MOS transistor may also be employed. Furthermore, an actual capacity was not provided for output capacity 102, but rather the input capacity of the subsequent stage circuit functioned equivalently as the output capacity of this circuit; however, it is of course the case that an actual capacity may be provided. Furthermore, a method in which the potential of the gate electrode was directly altered was used as the method for changing the voltage between gate and source in the MOS transistors; however, the potential of the gate electrode may be altered indirectly via a capacity or the like, and furthermore, the potential of the gate electrode may be fixed, and the potential of the element on the ground side of storage capacity 101 may be changed in the amplification stage. In the structure described, the resetting of storage capacity 101 was accomplished by grounding junction 104; however, such grounding is not necessarily required, and a potential lower than the gate electrode potential of the N type MOS transistor, less the threshold value thereof, may be applied.

Figure 2:
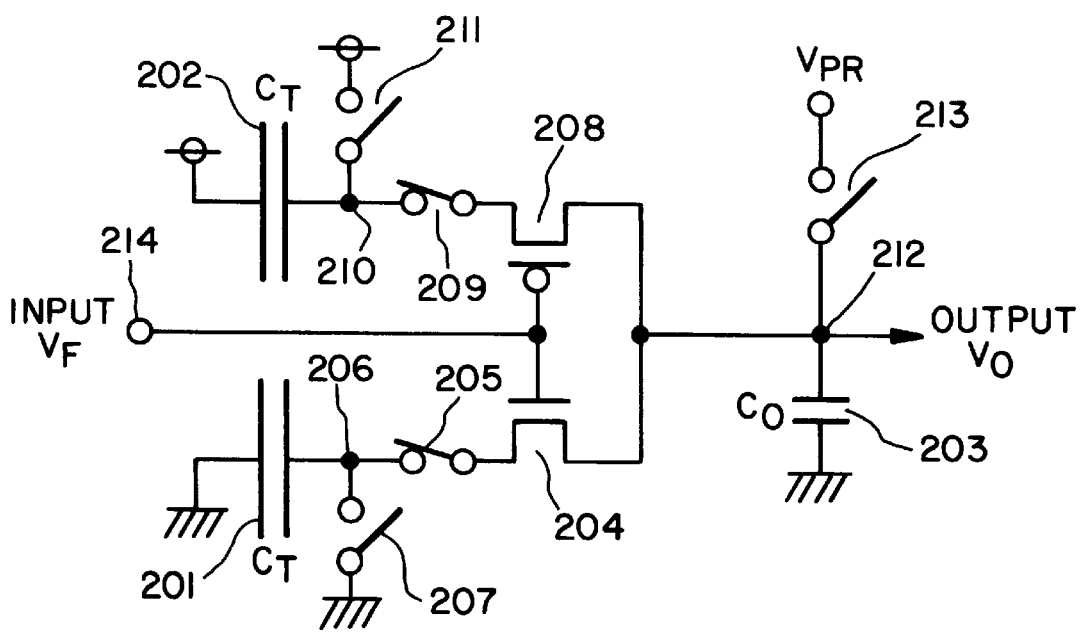
FIG. 2 is a structural diagram showing a charge transfer amplifier circuit in accordance with embodiment 2.

FIG. 2 is a schematic diagram of a charge transfer amplifier circuit showing a second embodiment of the present invention. This circuit is a CMOS charge transfer amplifier circuit in which a first circuit, employing a P type MOS transistor, and a second circuit, employing an N type MOS transistor, are combined.

In the figure, references 201 and 202 indicate storage capacities (first capacities) having a capacity of $C_T$, while reference 203 indicates an output capacity (second capacity) having a capacity of $C_O$. An actual capacity is not provided for output capacity 203; rather, the input capacity of the subsequent stage circuit functions equivalently as the output capacity of the present circuit. Reference 204 indicates an N type MOS transistor; the source electrode thereof is connected via switch 205 to storage capacity 201, and the reset switch 207 of storage capacity 201, at junction 206. Reference 208 indicates a P type MOS transistor; the source electrode thereof is connected via a switch 209 with the storage capacity 202, and a reset switch 211 of the storage capacity 202, at junction 210. The drain electrode of N type MOS transistor 204 and the drain electrode of P type MOS transistor 208 are connected with output capacity 203 and the precharge switch 213 at output junction 212. The gate electrode of N type MOS transistor 204 and the gate electrode of P type MOS transistor 208 are connected, and form an input junction 214.

The circuit operates in three stages in the same manner as the N type transistor circuit of the first embodiment. The first stage is the reset stage; here the resetting of the storage capacities 201 and 202 is conducted. Switches 207 and 211 are placed in the ON position, junction 206 is grounded, and power is supplied to junction 210, so that storage capacities 201 and 202 are reset. At this time, switches 205 and 209 are placed in the OFF position, and this prevents the passage of current through P type MOS transistor 208, output junction 212, and N type MOS transistor 204.

The second stage is the precharge stage. Switches 207 and 211 are placed in the OFF position, and switches 213, 205, and 209 are placed in the ON position. A voltage $V_F$ is applied to input junction 214 of the circuit. At this time, output capacity 203 is precharged to the precharge voltage $V_{PR}$, a current passes through N type transistor 204 and P type MOS transistor 208, and the charging (precharging) of storage capacities 201 and 202 is initiated. Eventually, the potential of junction 206 rises, and when the potential difference between the gate and source of the N type MOS transistor 204 becomes equal to the threshold value $V_{THN}$ of the N type MOS transistor 204, the N type MOS transistor enters an OFF state, and the current ceases to flow, and the precharging of the storage capacity 201 is thus automatically terminated. In the same manner, when the potential of junction of 210 declines, and the potential difference between the gate and source of the P type MOS transistor 208 becomes equal to the threshold value $V_{THP}$ of the P type transistor 208, the P type MOS transistor 208 enters an OFF state, a current ceases to flow, and the precharging of the storage capacity 202 is automatically terminated. At this time, the potential of the junction 206 which is connected with the source electrode of the N type MOS transistor 204 becomes $V_F-V_{THN}$. In the same way, the potential of junction 210, which is connected with the source electrode of P type MOS transistor 208, becomes $V_F-V_{THP}$.

In actuality, when the potential difference between the gate and source of a MOS transistor becomes equal to the threshold value thereof or even declines further, a very small weak inversion current continues to flow in the MOS transistor. However, in the CMOS charge transfer amplifier circuit of the present embodiment, the weak inversion current flowing in the N type MOS transistor 204 and the weak inversion current flowing in the P type MOS transistor 208 are essentially balanced, and the inflow and outflow of charge from the precharge power source $V_{PR}$ is effectively eliminated. Accordingly, the precharging is effectively terminated.

A third stage is the amplification stage. Switch 213 is placed in the OFF position. Switches 207 and 211 are placed in the OFF positions, while switches 205 and 209 remain in the ON position. At this time, the potential of the input junction 214 of the circuit increases by $\Delta V_F$ from the level of $V_F$, and becomes $V_F+\Delta V_F$. When this occurs, in the same way as in the N type MOS transistor circuit of embodiment 1, the voltage between the gate and the source of N type MOS transistor 204 becomes larger than the threshold value $V_{THN}$ thereof, so that current begins to flow. The current flowing at this time transfers the charge stored in the output capacity 203. Eventually, the potential difference between the gate and the source in the N type MOS transistor 204 again becomes equal to the threshold value $V_{THN}$ thereof, the N type MOS transistor 204 enters an OFF state, and the current ceases. The potential of the junction 206 which is connected to the source electrode of the N type MOS transistor 204 then becomes $V_F-V_{THN}+\Delta V_F$. In other words, in the same way as the potential change in the input junction 214, a change of $\Delta V_F$ from the precharge stage is observed. At this time, in P type MOS transistor 208, an increase of $\Delta V_F$ from the potential $V_F$ of input junction 214 has been experienced, and a level of $V_F+\Delta V_F$ has been realized, so that the absolute value of the voltage between the gate and the source thereof becomes smaller than the absolute value of the threshold value $V_{THP}$ thereof, and thus the transistor remains in an OFF state, and current does not flow. Accordingly, the charge current is only the current from output capacity 203 to storage capacity 201, and the amount of this charge is $\Delta Q=C_T \cdot \Delta V_F$. The charge becomes smaller by $\Delta Q=C_T \cdot \Delta V_F$ from output capacity 203, so that the terminal voltage of the output capacity, in other words, the potential of the output junction 212, changes by $\Delta V_O=-C_T \cdot \Delta V_F/C_O$. In other words, an amplification is conducted with an amplification factor of $-C_T/C_O$.

When the potential of the input junction 214 of the circuit decreases, on the other hand, the N type MOS transistor remains in an OFF state, and the P type MOS transistor becomes activated again, and charge transfer takes place between the storage capacity 202 connected to the P type MOS transistor and the output capacity 203, and amplification is conducted in the same manner.

In actuality, in the CMOS charge transfer amplifier circuit of the present embodiment, as noted in the description of the precharge stage, a weak inversion current flows in N type MOS transistor 204 and P type MOS transistor 208 in the initial state of the amplification stage. As a result of the changes in potential of the input junction 214, a difference develops between the weak inversion currents flowing in N type MOS transistor 204 and P type MOS transistor 208, and charge transfer occurs with the output capacity 203 by the amount of this difference; however, this causes no problem even if it is interpreted as the flowing of a current to only one or the other of the N type MOS transistor 204 and the P type MOS transistor 208, as described above.

As described above, the CMOS charge transfer amplifier circuit of the present invention is a circuit which has the function of conducting amplification with respect to changes in the positive or negative direction in an input signal.

As is clear from the operation of the circuit, a stationary direct current does not flow in the circuit. It thus becomes possible to conduct voltage amplification with low power consumption.

Furthermore, even if the element characteristics of the N type MOS transistor 204 or the P type MOS transistor 208, such as the threshold values $V_{THN}$ and $V_{THP}$ thereof, fluctuate, there is no effect on the amplification function. In other words, the circuit possess the function of correcting fluctuations in the element characteristics.

Figure 3:
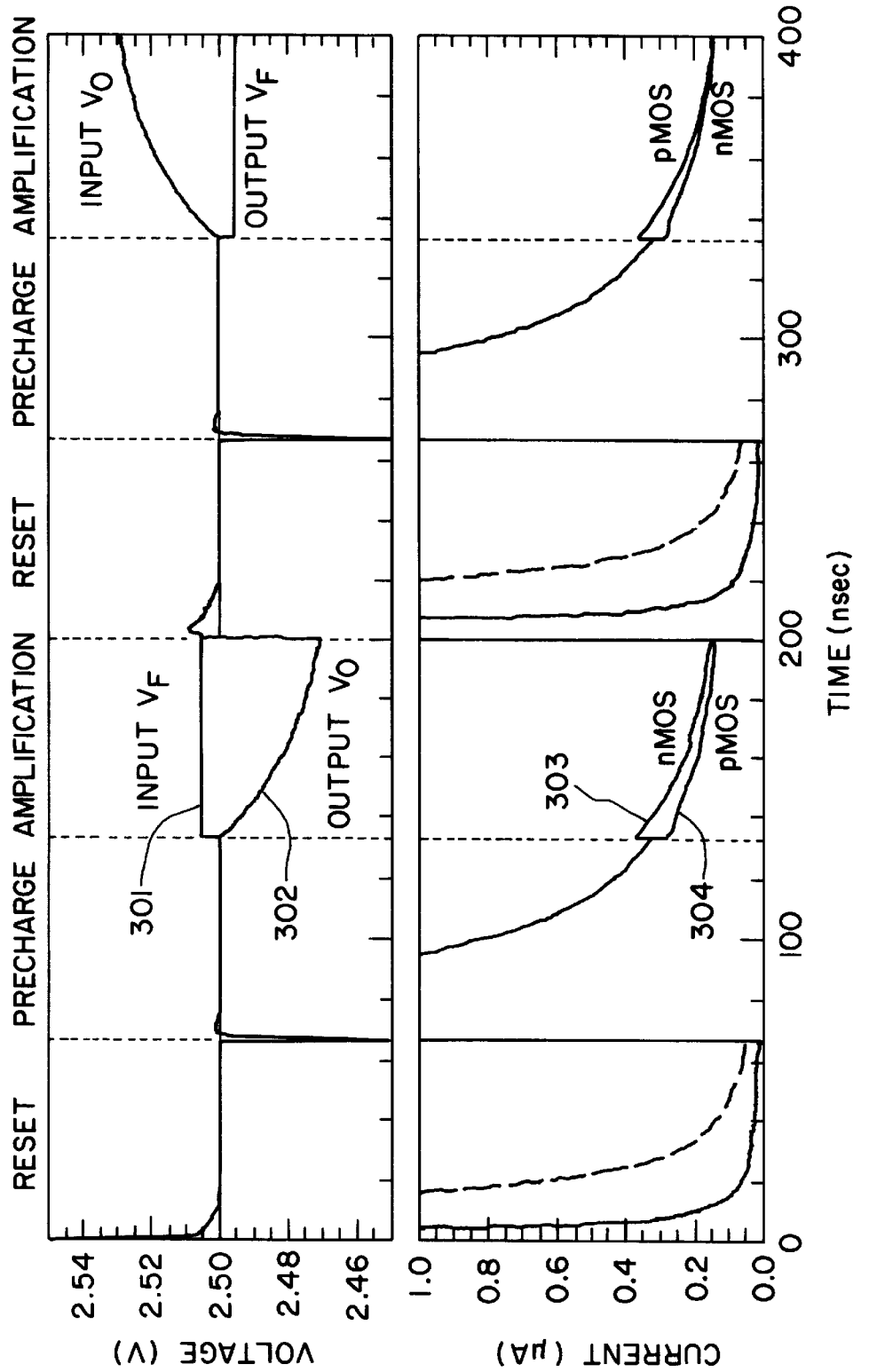
FIG. 3 is a graph showing the operational waveform of the charge transfer amplifier circuit of embodiment 2.

FIG. 3 shows the operations waveform of the circuit of the present invention. Reference 301 in the upper figure indicates the changes in potential of the input junction 214, while reference 302 indicates the changes in potential in output junction 212. Furthermore, reference 303 in the lower figure indicates the changes in the current flowing through N type MOS transistor 204, while reference 304 indicates the changes in the current flowing through P type MOS transistor 208. In the precharge stage, it can be seen that the current 303 flowing through the N type MOS transistor and the current 304 flowing through the P type MOS transistor are essentially equal. Furthermore, in the first amplification stage, the potential of the input junction 214 changes by +5 mV from 2.5 V, by means of this, the current 303 flowing through the N type MOS transistor is increased, and it can be seen that the current 304 of the P type MOS transistor is decreased. A charge corresponding to this difference in the currents is transferred, and as shown by reference 302, the potential of the output junction changes greatly, by approximately −30 mV. In the second amplification stage, the potential of input junction 214 changes by −5 mV from 2.5 V. By means of this, the current flowing through the N type MOS transistor is decreased, while the current 304 flowing through the P type MOS transistor is increased. The potential 302 of the output junction changes by approximately +30 mV. $-C_T/C_O$ is set to a value of −6, so that the degree of amplification is approximately −6.

Figure 4:
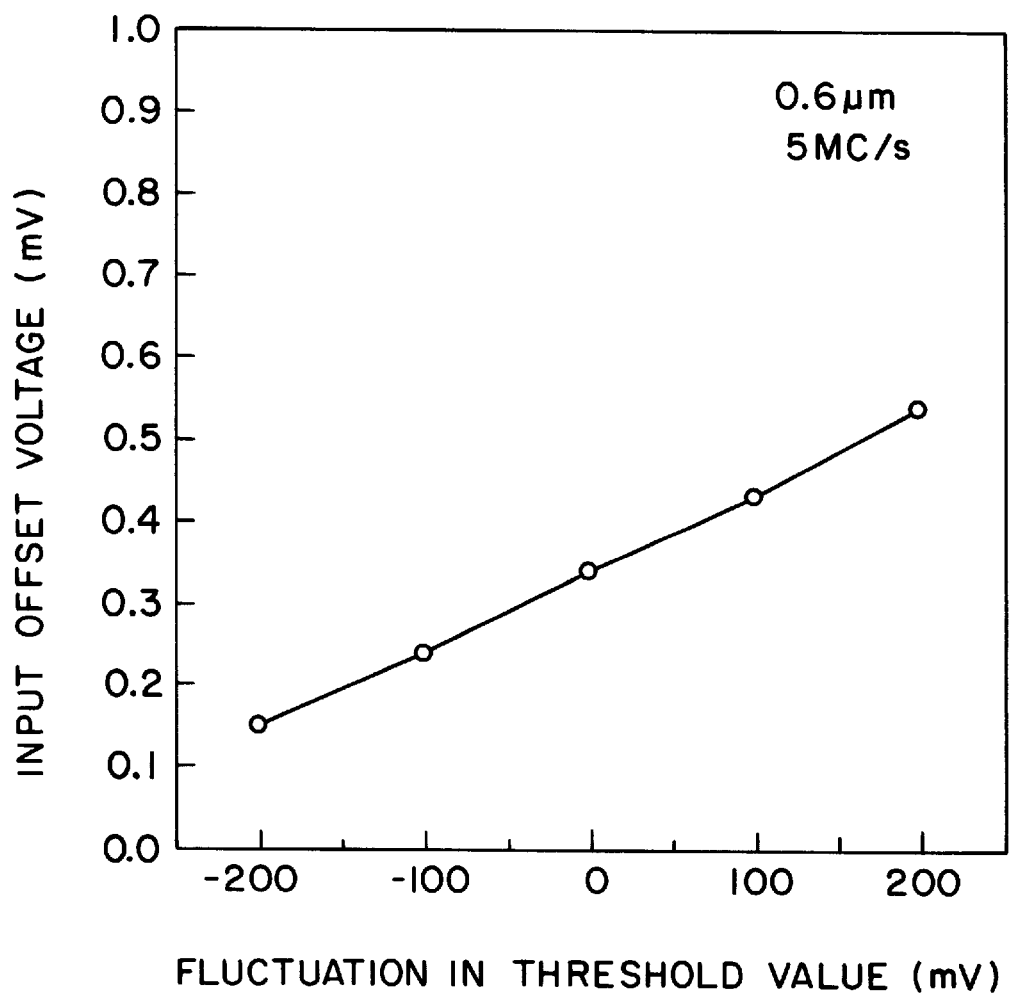
FIG. 4 is a graph showing the relationship of the input offset voltage with respect to changes in the threshold value of the CMOS charge transfer amplifier circuit of embodiment 2.

FIG. 4 shows the results of an investigation into the effects of fluctuations in device characteristics with respect to the operation of the CMOS charge transfer amplifier circuit of the present embodiment. The fluctuations in the input offset voltage of the circuit which result when the threshold value $V_{THN}$ of the N type MOS transistor 204 fluctuates by +200 mV are plotted. Here, what is meant by the input offset voltage is the potential change which must be applied to the input junction in order to halt the output potential change at 0, in the amplification stage; ideally, this has a value of 0. However, as a result of unbalance states in the element characteristics within the circuit or the like, a limited input offset voltage may exist, and in a circuit which does not have a mechanism for correcting fluctuations in the element characteristics, the input offset voltage also fluctuates as a result of variations in the element characteristics within the circuit. However, in the circuit of the present embodiment, as shown in FIG. 4, the input offset voltage changes by only approximately 0.4 mV with respect to changes in the threshold value of ±200 mV. It can thus be seen that the CMOS charge transfer amplifier circuit of the present embodiment has the function of correcting fluctuations in the element characteristics.

In the present embodiment, the output capacity 203 was not an actual capacity, but rather, the input capacity of the subsequent stage circuit equivalently functioned as the output capacity of the present circuit; however, it is of course the case that an actual capacity may be provided. The storage capacities 201 and 202 were set to the same capacity value; however, the values thereof may be different, insofar as the resulting unbalanced state within the circuit does not present a problem. Furthermore, the method which was described for changing the voltage between the gate and the source of the MOS transistors was one in which the potential of the gate electrode was directly altered; however, the potential of the gate electrode may be indirectly altered via a capacity or the like, and furthermore, the potential of the gate electrode may be fixed, and the potential of the ground side element of storage capacity 201, and the potential of the power source side element of storage capacity 202, may be altered in the amplification stage. Junction 206 was grounded in order to reset the storage capacity 201; however, it is not absolutely necessary to conduct such grounding, and a potential lower than the gate electrode potential of the N type MOS transistor, less the threshold value thereof, may be applied. In the same way, junction 210 was connected to the power source in order to reset the storage capacity 202; however, such a connection to the power source is not absolutely necessary, and a potential higher than the potential of the gate electrode of the P type MOS transistor, to which is added the absolute value of the threshold value thereof, may be applied. Switches 205 and 209 were provided in order to prevent a current flow during the reset stage; however, other methods may be employed as long as they are capable of preventing such a current flow, so that for example, the terminals of the storage capacities 201 and 202 may be short-circuited using switches during resetting; however, at this time, a mechanism may be provided for placing the elements on the opposite side from the junctions 206 and 210 in an electrically floating state, thus preventing a current flow.

Figure 5:
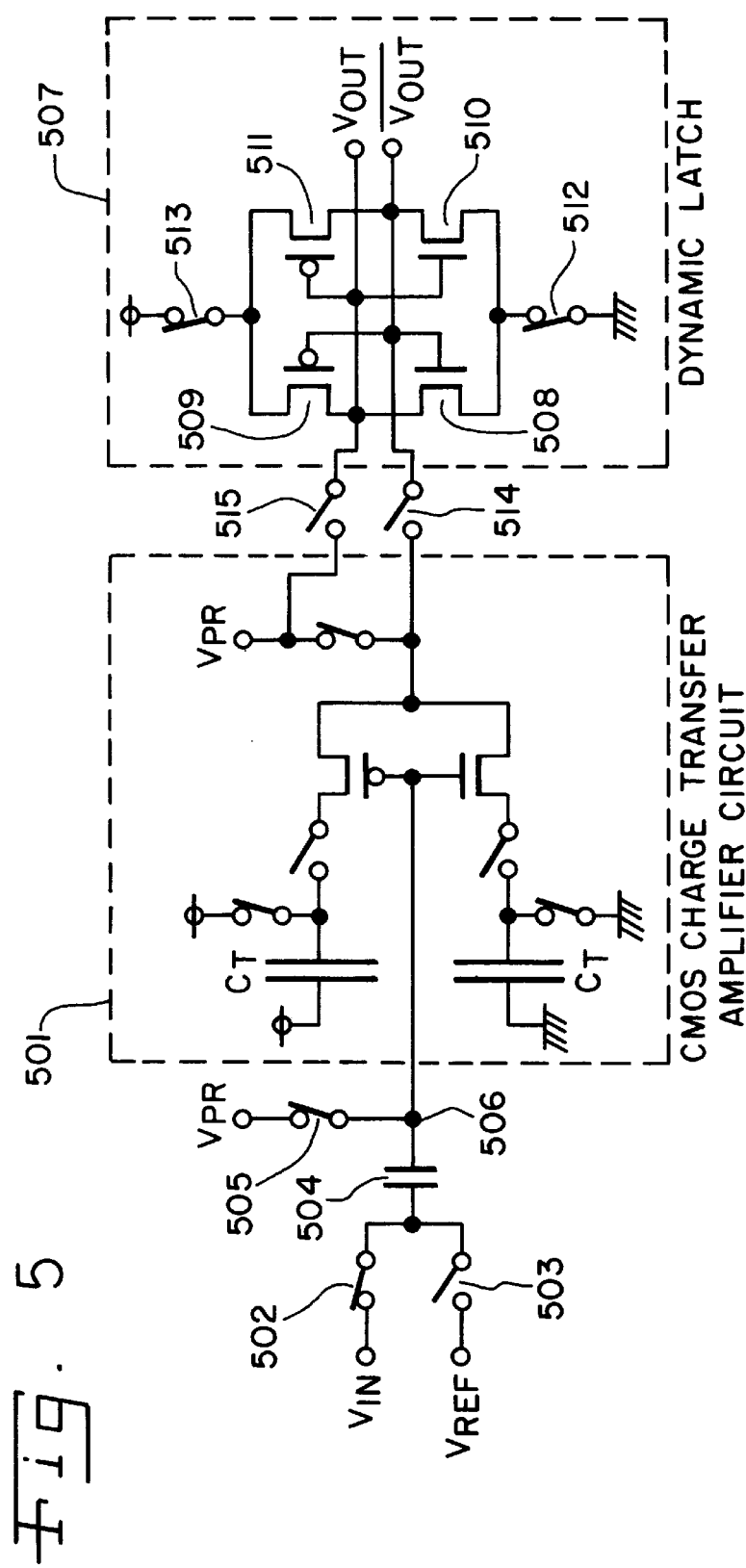
FIG. 5 is a circuit structural diagram showing the voltage comparator indicated in embodiment 3.

FIG. 5 is a schematic diagram of a voltage comparator which shows a third embodiment of the present invention. This circuit is a voltage comparator in which a dynamic latch circuit is connected to the output of the CMOS charge transfer amplifier circuit shown in the second embodiment, and an input sampling circuit is connected to the input part thereof. In the figure, reference 501 indicates the CMOS charge transfer amplifier circuit described in the second embodiment. Reference 502 indicates a first input changeover switch, reference 503 indicates a second input changeover switch, reference 504 indicates an input sampling capacity, and reference 505 indicates a precharge switch. Reference 506 indicates the input terminal of the CMOS charge transfer amplifier circuit 501. Reference 507 indicates the dynamic latch circuit. Within the dynamic latch circuit 507, reference 508 indicates a first N type MOS transistor, reference 509 indicates a first P type MOS transistor, reference 510 indicates a second N type MOS transistor, reference 511 indicates a second P type MOS transistor, reference 512 indicates a first latch control switch, and reference 513 indicates a second latch control switch. Reference 514 indicates a switch which controls the connection and disconnection of the output of the CMOS charge transfer amplifier circuit 501 and the input of dynamic latch 507. reference 515 indicates a switch which controls the connection and disconnection of the other input terminal of the dynamic latch 507 and $V_{PR}$, which is employed as a reference voltage.

Dynamic latch 507 also operates in 3 stages per cycle, as was the case with CMOS charge transfer amplifier circuit 501, so that the voltage comparator of the present embodiment, which combines these circuits, operates in three stages.

In the first stage, the resetting operation of CMOS charge transfer amplifier circuit 501, and the latching operation of the dynamic latch 507, are conducted. In other words, in dynamic latch 507, switches 514 and 515 are placed in the OFF position, and the dynamic latch circuit is isolated. The latch control switches 512 and 513 within the dynamic latch circuit are placed in the ON position, the signal inputted in the previous cycle is amplified, and the output is displaced to the ground potential or the power source potential.

In the second stage, the precharging operation of CMOS charge transfer amplifier circuit 501, and the resetting operation of dynamic latch 507, are conducted. At this time, input changeover switch 502 is placed in an ON state, while switch 503 is placed in an OFF state, and precharge switch 505 is placed in an ON position. Accordingly, the comparator input signal $V_{IN}$ and the precharge voltage $V_{PR}$ are applied to the two ends of input sampling capacity 504. The precharge voltage $V_{PR}$ is applied to the input terminal 506 of the CMOS charge transfer amplifier circuit 501, that is to say, to the gate electrodes of the N type MOS transistor and the P type MOS transistor within the CMOS charge transfer amplifier circuit, and the precharging of the CMOS charge transfer amplifier circuit is conducted. Switches 514 and 515 are placed in the ON position while latch control switches 512 and 513 within the dynamic latch 507 are placed in the OFF position, and both input terminals of the dynamic latch are reset to the precharge voltage $V_{PR}$.

In the third stage, the amplification operation of the CMOS charge transfer amplifier circuit 501, and the input transfer operation of the dynamic latch 507, are conducted. First, the precharge switch 505 is placed in the OFF position, and the input terminal 506 of the CMOS charge transfer amplifier circuit 501 is placed in a floating state. Input changeover switch 502 is placed in the OFF position, and switch 503 is placed in the ON position, and a reference voltage $V_{REF}$ is applied to the input sampling capacity 504. At this time, the potential difference between the reference signal $V_{REF}$ and the input signal $V_{IN}$ which was applied in the second stage is capacitively divided by the input sampling capacity 504 and the input capacity of the CMOS charge transfer amplifier circuit, that is to say, by the sum of the gate capacity of the N type MOS transistor and the gate capacity of the P type MOS transistor, and this appears in input terminal 506 as a potential change. If the capacity of the input sampling capacity 504 is set so as to be sufficiently large in comparison with the input capacity of the CMOS charge transfer amplifier circuit, then a potential change is produced in input terminal 506 which is essentially equal to the difference in potential between the reference signal $V_{REF}$ and the input signal $V_{IN}$. As a result of this change of potential of the input terminal, voltage amplification is conducted within CMOS charge transfer amplifier circuit 501, and the output thereof is transferred to one of the input terminals of dynamic latch 507 via switch 514. The precharge voltage continues to be applied to the other input terminal via switch 515, so that a potential difference is produced between the two input terminals of the dynamic latch 507. This potential difference is amplified in the first stage of the following cycle via the dynamic latch latching operation, and the larger of input signal $V_{IN}$ and reference signal $V_{REF}$ is outputted.

By repeating cycles comprising the three steps described above, voltage comparison is conducted in a cyclically continuous manner.

As shown in the second embodiment, the CMOS charge transfer amplifier circuit is capable of conducting voltage amplification without being affected by fluctuations in the element characteristics. Accordingly, an input offset voltage is present in the dynamic latch, and even if there are variations in this between circuits, the voltage comparator of the present embodiment, in which the CMOS charge transfer amplifier circuit is connected to the prestage, is capable of effectively reducing the input offset voltage so that a high comparison accuracy is obtained. High resolution A/D converters are a possible application thereof.

Furthermore, a stationary current does not flow in either the CMOS charge transfer amplifier circuit 501 or the dynamic latch 507, so that the power consumption of the voltage comparator of the present embodiment is extremely small.

Figure 6:
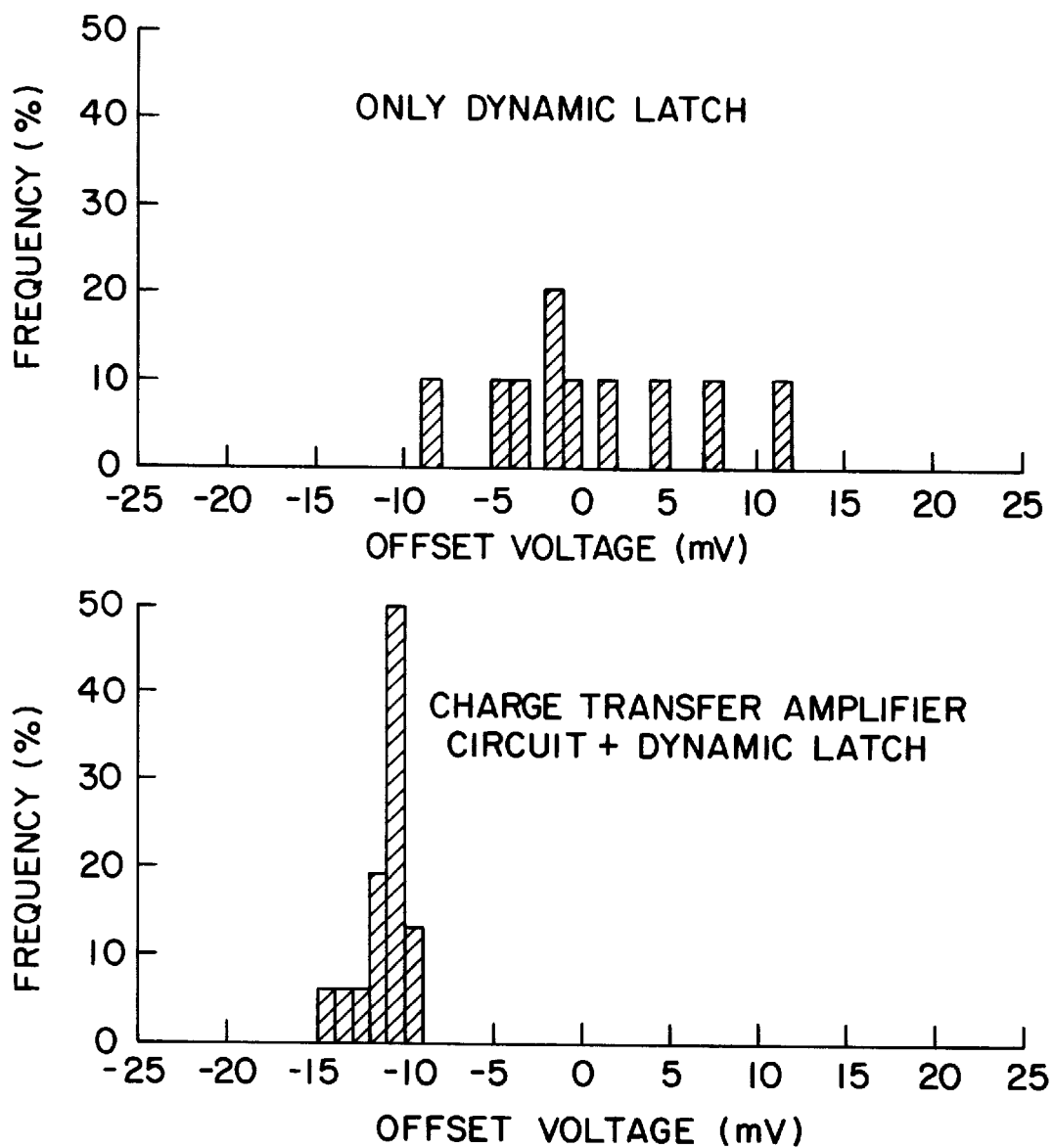
FIG. 6 is a graph showing the frequency of the fluctuations in the offset voltage of the voltage comparator.

FIG. 6 shows a measurement of the variations in the offset voltage of the voltage comparator. The case in which the dynamic latch itself was employed as a voltage comparator is shown in the upper graph, while the case in which a voltage comparator having a structure such that a CMOS charge transfer amplifier circuit was connected to the prestage of the dynamic latch, as shown in the present embodiment, was employed is shown in the bottom graph. When only the dynamic latch is employed, the offset voltage varies within a rang of approximately 20 mV. However, when a comparator is employed which is provided with a CMOS charge transfer amplifier circuit, the variation is within a range of only 6 mV. This is approximately half of the 11.7 mV of the quantized voltage (LSB) of a 3 V full scale range 8 bit A/D converter, and this indicates that this voltage comparator is sufficiently applicable as an 8 bit A/D converter. In the lower graph in FIG. 6, the average value of the offset voltage itself is shifted by approximately −12 mV; however, this is the offset voltage of the CMOS charge transfer amplifier circuit itself, which results from the unbalanced state of the currents of the N type MOS transistor and the P type MOS transistor within the CMOS charge transfer amplifier circuit, and in a circuit with the same design, even if the element characteristics varied slightly between units, the same offset voltage shift would appear. Such an overall shift does not have a non-linear effect in A/D converter applications, so that no problem is presented.

Figure 7:
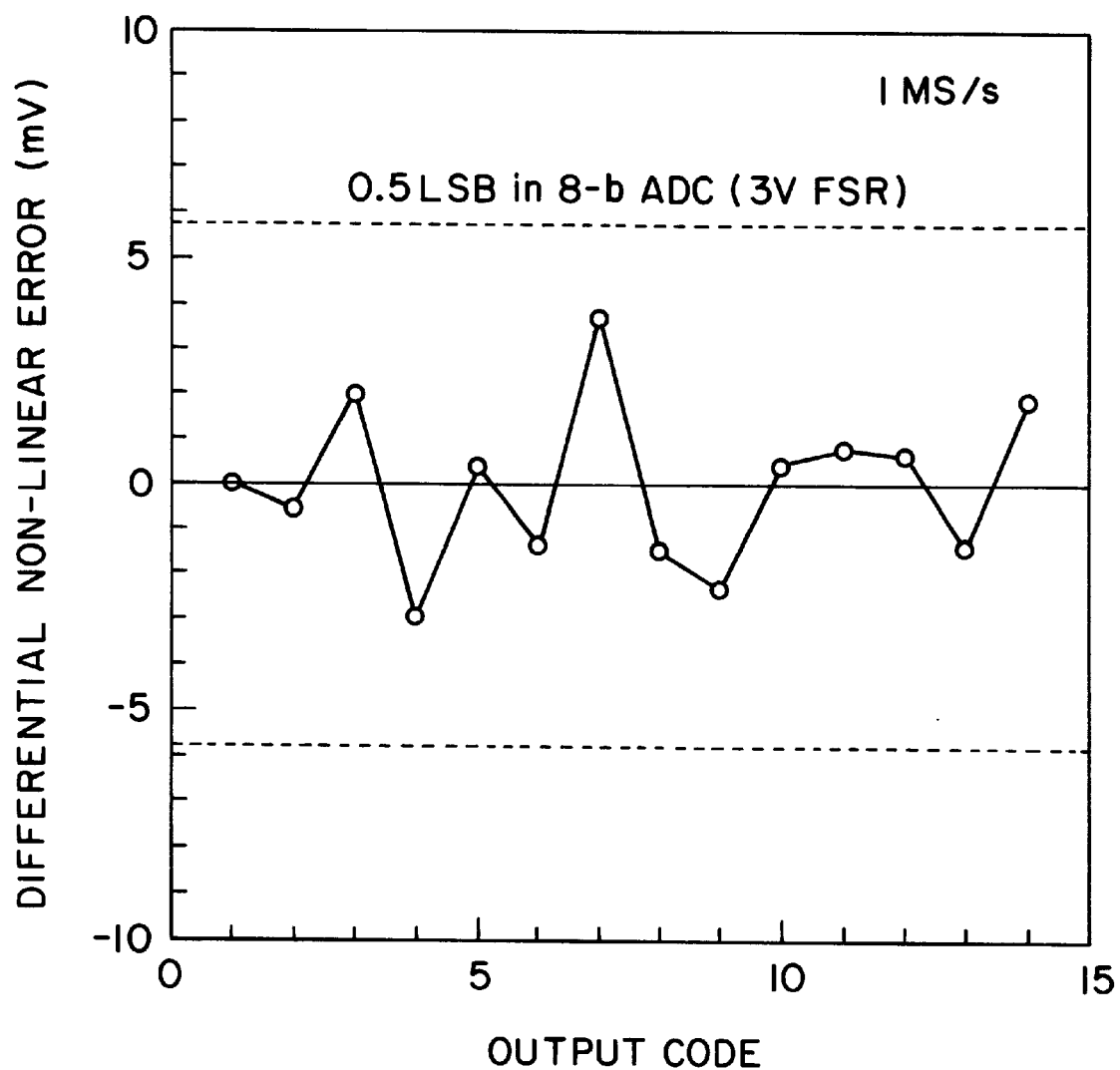
FIG. 7 is a graph showing the results of a measurement of the differential non-linearity of a 4 bit A/D converter.

Using 15 of the voltage converters of the present embodiment, a 4 bit A/D converter was constructed. The results of a measurement of the differential non-linearity thereof are shown in FIG. 7. The differential non-linear error was ±4 mV or less. In the figure, the dotted line indicates the allowable value of ±0.5 LSB (±5.86 mV) in a 3 V full scale range 8 bit A/D converter. It can be seen that the voltage converter of the present embodiment realizes 8 bit accuracy.

Figure 8:
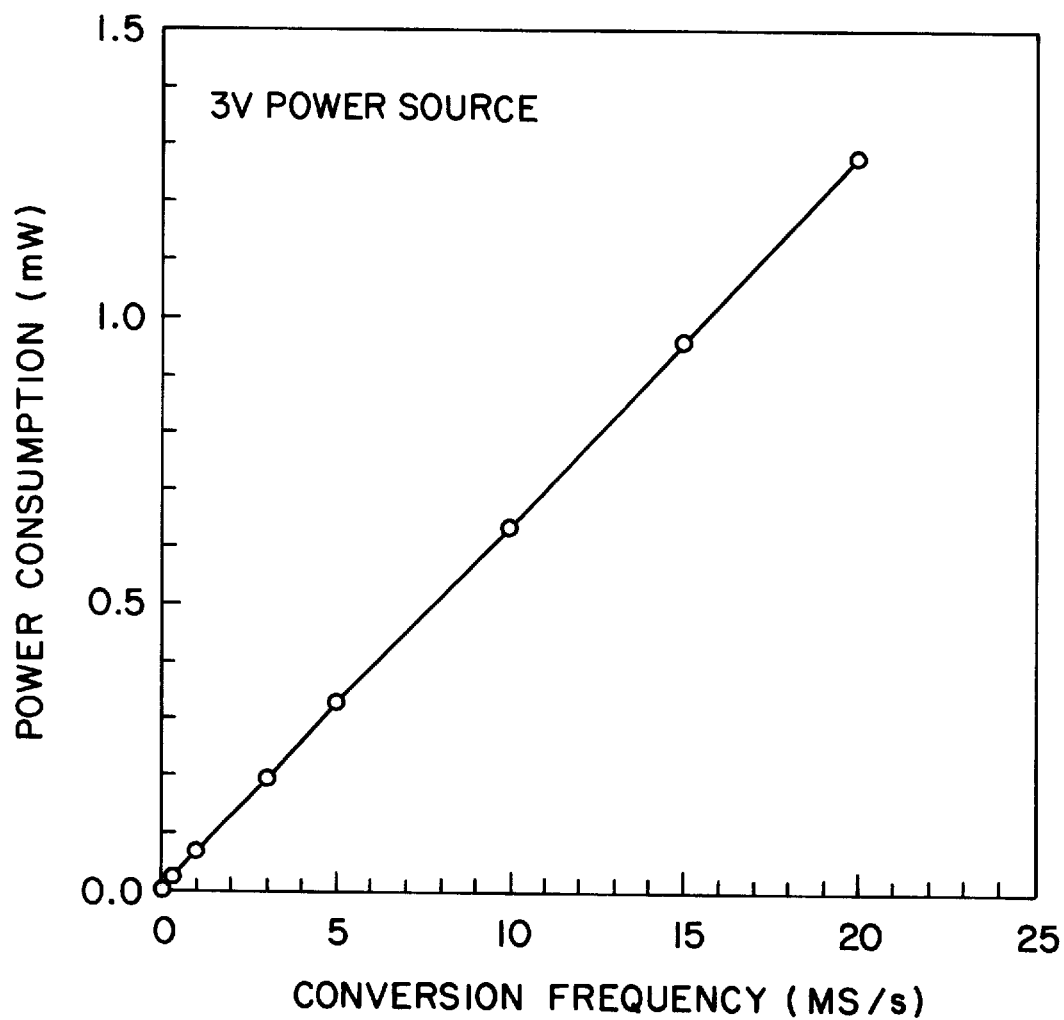
FIG. 8 is a graph showing the relationship between the power consumption and the conversion frequency of a 4 bit A/D converter.

FIG. 8 shows the power consumption of the 4 bit A/D converter. The power consumption is proportional to the conversion frequency, so that it can be seen that a stationary current does not flow in any of the circuits. The power consumed per voltage comparator and per conversion frequency of 1 MS/s was approximately 4.3 µW, and this is a low power consumption in comparison with conventional voltage comparators.

In the present embodiment, a typical dynamic latch circuit was employed; however, other circuits may be employed as long as a stationary current does not flow therein, so that for example, a current control type latch sense amplifier circuit or the like may be employed. Furthermore, in the present embodiment, the input signal $V_{IN}$ was applied to input sampling capacity 504 in the second stage, while the reference signal $V_{REF}$ was applied thereto in the third stage; however, it is of course the case that this order may be reversed depending on the use. The signal applied to the input sampling capacity 504 in the first stage may be either the input signal $V_{IN}$ or the reference signal $V_{REF}$, or alternatively, no signal may be applied.

In embodiment four of the present invention, structurally, the charge transfer positive feedback amplifier circuit of the present invention comprises a storage capacity, a N type MOS transistor and P type MOS transistor, the respective source electrodes of which are connected to the terminals of the storage capacity, and at least one of a feedback loop which connects the drain electrode of the N type MOS transistor and the gate electrode of the P type MOS transistor and a feedback loop which connects the drain electrode of the P type MOS transistor operates in three stages. These are, in other words, the reset period, the precharge period, and the amplification period.

In the reset period, the design of the terminals of the storage capacity is such that the absolute value of the difference between the potential of the respective terminals and the potential of the gate electrodes of the MOS transistors connected to these terminals becomes larger than the absolute value of the threshold value of these transistors.

In the precharge period, the drain electrodes of the respective MOS transistors are biased to predetermined potentials, respectively, and the storage capacity is charged via the respective MOS transistors. In the resetting period, the potential of both terminals of the storage capacity, which is designed so that the absolute value of the difference between the potential of the gate electrodes of the MOS transistors connected to the respective terminals becomes larger than the absolute value of the threshold value of the respective transistors, changes in the direction of the gate electrode potential of the respective transistors, and eventually, when the absolute value of the difference between the gate electrode potentials of the MOS transistors connected to the respective terminals (the potential between the gate and source of the MOS transistors) becomes equal to the absolute value of the threshold values of the respective transistors, the charging of the storage capacities is automatically terminated by the source follower principle.

In the amplification period, the drain electrodes of the two MOS transistors which are connected to the feedback loop are placed in an electrically floating state. At the same time, the change in the input voltage is transmitted as the change in the increase in the absolute value of the voltage between the gate and the source of at least one of the two MOS transistors, and transmitted MOS transistor again s initiated. As a result of this current, the potential of the terminal of the storage capacity which is connected to the source electrode of the MOS transistor approaches the gate voltage of the MOS transistor. By means of the capacitive coupling of the storage capacity, the potential of the terminal on the opposite side of the storage capacity also changes in the same direction. This change operates in the direction of increase of the absolute value of the gate/source potential of the MOS transistor connected to the terminal on the opposite side of the storage capacity. Simultaneously, if the feedback loop is connected to the drain electrode of the MOS transistor to which the input signal is transmitted, the potential of the drain electrode, which is in an electrically floating state, changes in the opposite direction from the change in the gate potential, as a result of charge transfer between the capacity formed by the gate electrode and the storage capacity. This change in potential is transmitted to the gate electrode of the MOS transistor on the opposite side by the feedback loop, and this acts to increase the absolute value of the gate/source potential of the MOS transistor.

By means of the structure described above, the changes in an input voltage are transmitted as changes in the increase in the absolute value of the gate/source voltage of at least one MOS transistor, and furthermore, this is transmitted as a change in the increase in the absolute value of the gate/source voltage of the MOS transistor which is on the opposite side of the storage capacity from the transmitted MOS transistor and is of the opposite conductivity type thereto.

Furthermore, by means of a similar principle, this change is transmitted further in the direction of increase of the gate/source voltage of the MOS transistor to which the change in the input voltage was transmitted. As a result of this positive feedback mechanism, an input signal having an extremely small voltage change, and may appear in the drain electrode which is in an electrically floating state.

In other words, the circuit of the present invention is voltage changes at an input terminal, quickly amplifies these, and outputs them as very large potential changes.

In the present invention, by means of a positive feedback mechanism and a charge transfer mechanism operating by means of a source follower, voltage amplification can be conducted at high speed and with a high amplification factor. Voltage amplification is possible without a direct current flow, and furthermore, the operational characteristics are unlikely to be affected by fluctuations in the element characteristics. By means of disposing this circuit as the prestage of a dynamic latch circuit, it is possible to effectively reduce variations in the offset voltage of the dynamic latch circuit, and a voltage comparator may be realized which is highly accurate and has low power consumption. By applying this circuit to an A/D converter, it is possible to realize an A/D converter which is highly accurate and has low power consumption. Furthermore, if this circuit is applied to the sense amplifier of a memory circuit, it is possible to realize a high speed sense amplifier which is highly accurate and has low power consumption.

Hereinbelow, the charge transfer positive feedback amplifier circuit of the present invention will be concretely explained with reference to FIG. 9.

Figure 9:
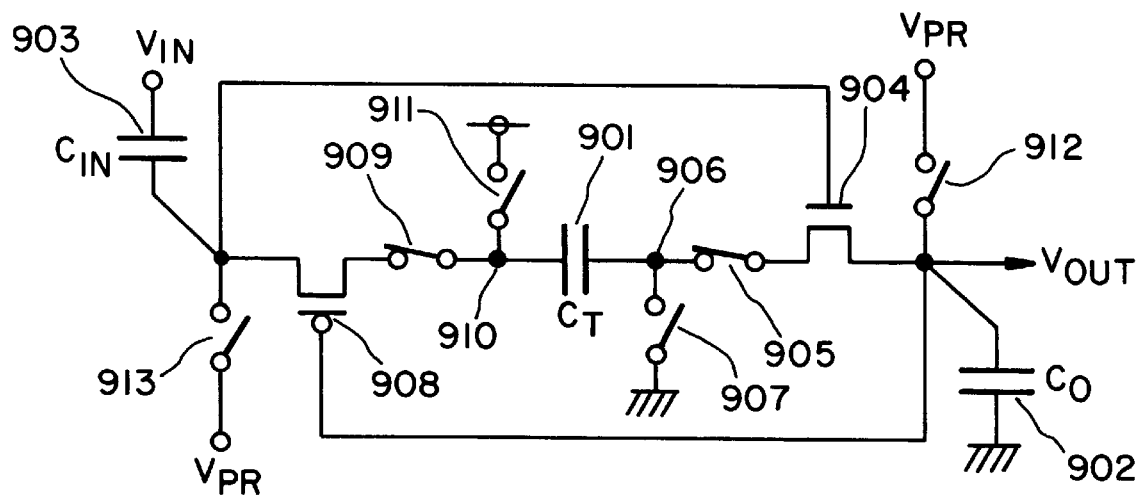
FIG. 9 is a circuit diagram showing the charge transfer positive feedback amplifier circuit of embodiment 4.

In FIG. 9, reference 901 indicates a storage capacity having a capacity of $C_T$, reference 902 indicates an output capacity having a capacity of $C_O$, and reference 903 indicates an input capacity having a capacity of $C_{IN}$ (a mechanism for changing the gate/source voltage of the first MOS transistor in response to an input signal having a changing voltage in the amplification period). Output capacity 902 is either a parasitic capacity of the output terminal, or is formed equivalently by the input capacity of the subsequent stage circuits transistor); the source electrode thereof is connected via connection switch 905 with storage capacity 901, and the reset switch 907 of storage capacity 901 (the mechanism for setting the terminals of the storage capacity to appropriate predetermined potentials, respectively, in the resetting period), at unction 906. Reference 908 indicates a P type MOS transistor (second MOS transistor); the source electrode thereof is connected via connection switch 909, at junction 910, with storage capacity 901 and the resetting switch 911 of storage capacity 901 (the mechanism for setting the terminals of the storage capacity to appropriate predetermined potentials, respectively, in the resetting period). The drain electrode of N type MOS transistor 904 is connected with output capacity 902 and the precharge switch 912 (the mechanism for setting the drain electrode of the first MOS transistor to an appropriate potential in the precharge period which follows the precharge period). The drain electrode of the P type MOS transistor 908 is connected with the input capacity 903 and the precharge period and for releasing this in the amplification period). Furthermore, the gate electrode of the P type MOS transistor 908 is connected to the drain electrode of the N type MOS transistor 904 (a connection between the gate electrode of the second MOS transistor and the drain electrode of the first MOS transistor), and the gate electrode of the N type MOS transistor 904 is connected with the drain electrode of the P type MOS transistor 908 (a connection between the gate electrode of the first MOS transistor and the drain electrode of the second MOS transistor), so that a double positive feedback loop is formed.

The circuit operates in three stages.

The first stage is the reset period; here, the resetting of storage capacity 901 is conducted. Reset switches 907 and 911 are placed in the ON position, junction 906 is grounded, and junction 910 is connected to the $V_{DD}$ power source, and the storage capacity 901 is reset. At this time, the connection switches 905 and 909 are set to the OFF position, and thus a current flow is prevented.

The second stage is the precharge stage. Reset switch 907 and switch 911 are placed in the OFF position, and connection switches 905 and 909 are placed in the ON position. At the same time, precharge switches 912 and 913 are placed in the ON position. At this time, a voltage of $V_{IN}$ is applied to the input junction of the circuit. Output capacity 902 is precharged to the precharge voltage $V_{PR}$, which is set to half of the power source voltage, and a current flows through the N type MOS transistor 904, while at the same time, input capacity 903 is precharged to a voltage which is the difference between the input voltage $V_{IN}$ and the precharge voltage $V_{PR}$, and a current flows through the P type MOS transistor 908, so that the charging of storage capacity 901 (precharging) is initiated. Eventually, the potential of junction 906 rises, and when the gate/source potential difference of the N type MOS transistor 904 becomes equal to the threshold value $V_{THN}$ thereof, the N type MOS transistor 904 enters an OFF state and current ceases to flow therein, and furthermore, the potential of junction 910 declines, and when the gate/source potential difference in P type MOS transistor 908 becomes equal to the threshold value $V_{THP}$ thereof, the P type MOS transistor 908 enters an OFF state, and current ceases to flow therein. By means of this, the precharging of storage capacity 901 is automatically terminated.

The third stage is the amplification period. The precharge switches 912 and 913 are placed in an OFF state. At this time, the potential of the input terminal is amplified. When this is accomplished, the gate potential of the drain electrode of P type MOS transistor 908 and N type MOS transistor 904 is larger than the threshold value $V_{THN}$, so that the N type MOS transistor 904 again enters an ON state, and a current flow is initiated. The current flowing at this time transfers the charge stored in output capacity 902. By means of the charge transfer principle, the potential of junction 906 rises, and the potential of the drain electrode of N type MOS transistor 904, which functions as the output junction, decreases. By means of this rise in the potential of junction 906, the potential of junction 910 also rises by means of the capacitive coupling of storage capacity 901. At the same time, the potential of the drain electrode of N type MOS transistor 904 decreases, and thereby, the potential of the gate electrode of the P type MOS transistor 908, which is connected to the drain electrode of the N type MOS transistor 904, also decreases. As a result of these two effects, the absolute value of the gate/source potential difference of P type MOS transistor 908 increases, and P type MOS transistor 908 again enters an ON state. A current flows, and by means of the charge transfer principle, the potential of junction 910 decreases and the potential of the drain of the p type MOS transistor 908 increases. As the potential of junction 910 decreases, the potential of junction 906 decreases by means of the capacitive coupling of storage capacity 901, and at the same time, the potential of the drain of P type MOS transistor 908 increases, and thereby, the potential of the gate electrode of N type MOS transistor 904 increases, and as a result, the gate/source potential difference of the N type MOS transistor 904 is further increase, so that charge transfer is more strongly promoted. By means of the positive feedback described above, the potential of the drain electrode of the N type MOS transistor 904, which is the output junction, rapidly decreases, and the potential of the drain electrode of P type MOS transistor 908 rapidly increases. The potential difference between the potential of N type MOS transistor 904 and junction 906 is eliminated, and when the potential difference between the potential of the drain electrode of P type MOS transistor 908 and junction 910 is eliminated, the voltage change resulting from the positive feedback is terminated.

In other words, this circuit detects slight positive voltage changes in the input terminal, and by means of a double positive feedback loop, rapidly amplifies these, and outputs them as large negative potential changes.

As is clear from the operation of the circuit, a stationary direct current does not flow in the circuit. Voltage amplification is thus possible which has low power consumption.

Furthermore, even if the device parameters, for example, the threshold values $V_{THN}$ or $V_{THP}$, of the N type MOS transistor 904 or P type MOS transistor 908 fluctuate, there is no effect on the amplification operation. In other words, the circuit has the function of correcting variations in the element characteristics.

In the present embodiment, a N type MOS transistor was employed as the MOS transistor, and a P type MOS transistor was employed as the second MOS transistor; however, it is of course the case that the opposite conductivity types may be employed. In such a case, negative changes in the input signal are amplified, and are outputted as large positive potential changes.

Furthermore, no actual capacity was provided for output capacity 902, but rather, the input capacity of the subsequent stage circuit functioned equivalently as the output capacity of the present circuit; however, it is of course the case that a capacity may be actually provided.

Furthermore, the output was obtained from the drain electrode of the N type MOS transistor 904; however, other positions are also acceptable, so that for example, the drain electrode of the P type MOS transistor 908 may be employed. In such a case, the output would be a large positive potential change in phase with the input signal.

Additionally, a mechanism in which the gate potential of the N type MOS transistor 904, which was connected with the drain electrode of the P type MOS transistor 908, was altered by the capacitive coupling of the input capacity 903, was adopted as the method for altering the gate/source voltage of the MOS transistors; however, other mechanisms may be employed, so that for example, a mechanism in which the gate potential of the P type MOS transistor 908, which is connected with the drain electrode of the N type MOS transistor 904, is altered, may be employed.

Furthermore, in the resetting of storage capacity 901, junction 906 was grounded, and junction 910 was connected to power source voltage $V_{DD}$; however, such a structure is not absolutely necessary, and appropriate voltages may be applied such that the absolute value of the gate/source potential of the respective MOS transistors is larger than the absolute value of the threshold values thereof.

A power source was used for the precharge power source which had a voltage which was half that of the power source voltage; however, it is of course the case that other voltages may be employed.

In the present embodiment, switches 905 and 909 were inserted between the source electrode of N type MOS transistor 904 and the terminal 906 of the storage capacity 901, and between the source electrode of P type MOS transistor 908 and the terminal 910 of the storage capacity 901; however, this was done in order to prevent a current flow during the reset period, and such switches may inserted on either the source side or the drain side of the MOS transistor, or may be eliminated entirely, so long as the increase in power consumption resulting from a current flow can be ignored.

Figure 10:
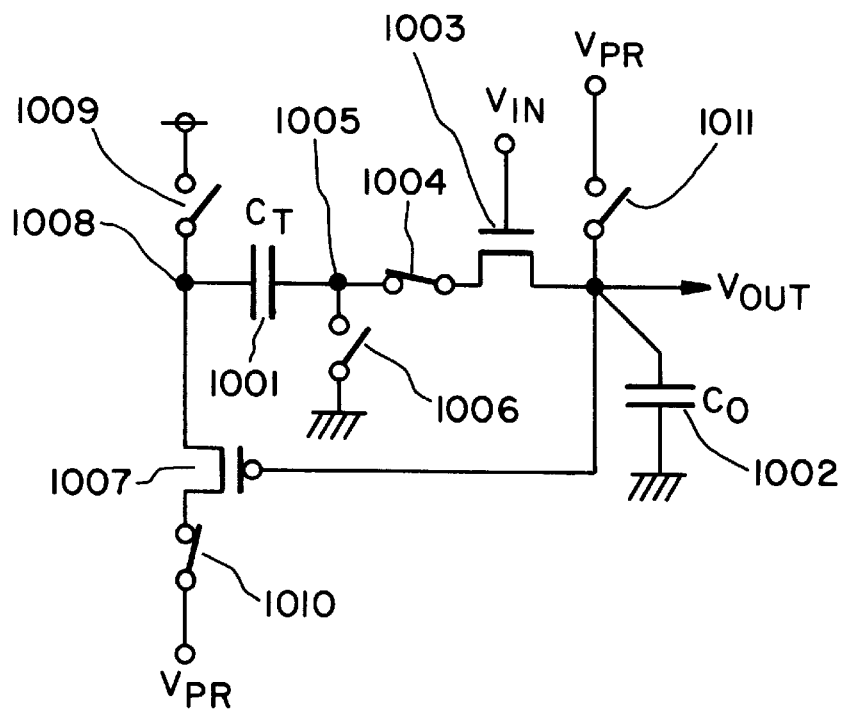
FIG. 10 is a circuit diagram showing the charge transfer positive feedback amplifier circuit of embodiment 5.

In embodiment five of the present invention, FIG. 10 is a schematic diagram of a circuit showing a fifth embodiment of the present invention. In the figure, reference 1001 indicates a storage capacity having a capacity of $C_T$, while reference 1002 indicates an output capacity having a capacity of $C_O$. Output capacity 1002 is formed by the parasitic capacity of the output terminal, or alternatively, the input capacity of the subsequent stage circuit may function equivalently as the output capacity of this circuit may function equivalently as the output capacity of this circuit. Reference 1003 indicates a N type MOS transistor (first MOS transistor); the source electrode thereof is connected, via connection switch 1004 and at junction 1005, with storage capacity 1001 and the reset switch 1006 of storage capacity 1001 (a mechanism for setting the terminals of the storage capacity to, respectively, appropriate predetermined potentials in the resetting period). Reference 1007 indicates a P type MOS transistor (second MOS transistor); the source electrode thereof is connected at junction 1008, with storage capacity 1001 (a mechanism for setting the terminals of the storage capacity to, respectively, appropriate predetermined potentials during the reset period). The drain electrode of the P type MOS transistor 1007 is connected via a connection switch 1010 with a precharge voltage $V_{PR}$, which is set to ½ of the power source voltage. The drain electrode of the N type transistor 1003 is connected with the output capacity 1002 and with a precharge switch 1011 (a mechanism for setting the drain electrode of the first MOS transistor to an appropriate predetermined potential during the precharge period which follows the reset period, and for releasing this in the amplification period which follows the precharge period). The gate electrode of the P type MOS transistor 1007 is connected with the drain electrode of the N type MOS transistor 1003 (a connection between the gate electrode of the second MOS transistor and the drain electrode of the first MOS transistor), and a positive feedback loop is formed. The gate electrode of the N type MOS transistor 1003 functions as the input terminal (a mechanism for altering the gate/source voltage of the first MOS transistor in response to an input signal, the voltage of which changes in the amplification period).

The circuit operates in the following three stages.

The first stage is the reset period; here, the resetting of the storage capacity 1001 is conducted. The reset switches 1006 and 1009 are placed in the ON position, the junction 1005 is grounded and the junction 1008 is connected to the $V_{DD}$ power source, and the storage capacity 1001 is set. At this time, the connection switches 1004 and 1010 are placed in the OFF position, so that a current flow is prevented.

The second stage is the precharge period. Reset switch 1006 and switch 1009 are placed in the OFF position, and connection switches 1004 and 1010 are placed in the ON position. At the same time, precharge switch 1011 is placed in the ON position. At this time, a voltage of $V_{IN}$ is applied to the input junction of the junction of the circuit. The output capacity 1002 is precharged to the precharge voltage $V_{PR}$, which is set to ½ of the power source voltage, and a current flows through the N type MOS transistor 1003, while at the same time, a current flows through the P type MOS transistor 1007, and the charging (precharging) of storage capacity 1001 is initiated. Eventually, the potential of junction 1005 rises, and when the gate/source potential difference in the N type MOS transistor 1003 becomes equal to the threshold value $V_{THN}$ thereof, the N type MOS transistor 1003 enters an OFF state, and current flow ceases, and furthermore, the potential of junction 1008 decreases, and when the gate/source potential difference in the P type MOS transistor 1007 becomes equal to the threshold value $V_{THP}$ thereof, the P type MOS transistor 1007 enters an OFF state, and current flow ceases. By means of this, the precharging of the storage capacity 1001 is automatically terminated.

The third stage is the amplification period. The precharge switch 1011 is placed in the OFF position. At this time, the gate potential of the N type MOS transistor 1003, which is the input terminal, is taken to be amplified. The gate/source potential of the N type MOS transistor 1003, which is the input terminal, is taken to be amplified. The gate/source potential of the N type MOS transistor 1003 is larger than the threshold value $V_{THN}$, so that the N type MOS transistor 1003 again enters an ON state, and current flow is initiated. The current flowing at this time transfers the charge stored in output capacity 1002. By means of the charge transfer principle, the potential of junction 1005 increases, and the drain potential of the N type MOS transistor 1003, which serves as the output junction, decreases. As a result of the increase in the potential of the junction 1005, the potential of the junction 1008 also increases as a result of the capacitive coupling of storage capacity 1001. At the same time, the potential of the drain electrode of the N type MOS transistor 1003 decreases, and as a result thereof, the potential of the gate electrode of the P type MOS transistor 1007, which is connected to the drain electrode of the N type MOS transistor 1003, also decreases. As a result, the absolute value of the gate/source potential difference in the P type MOS transistor 1007 increases, and the P type MOS transistor 1007 again enters an ON state. A current flows, the charge of junction 1008 is discharged, and the potential of junction 1008 decreases. As a result of this decrease in the potential of junction 1008, the potential of junction 1005 decreases as a result of the capacitive coupling of storage capacity 1001, and as a result, the gate/source potential difference in the N type MOS transistor is further increased, and charge transfer is more strongly promoted. By means of the positive feedback described above, the potential of the drain electrode of the N type MOS transistor 1003, which serves as the output junction, rapidly decreases. When the potential difference between the potential of the drain electrode of N type MOS transistor 1003 and junction 1005 is eliminated, the change of potential resulting from the positive feedback is terminated.

In other words, this circuit detects slight positive voltage changes in the input terminal, rapidly amplifies these by means of a single positive feedback loop, and outputs them as large negative potential changes.

As is clear from the circuit operation, a stationary direct current does not flow in the circuit. It is thus possible to conduct voltage amplification with low power consumption.

Furthermore, even if the device parameters, such as the threshold values $V_{THN}$ and $V_{THP}$, of the N type MOS transistor 1003 or the P type MOS transistor 1007 fluctuate, there is no effect on the amplification operation. In other words, the circuit has the function of correcting variations in the element characteristics.

In the present embodiment, a N type MOS transistor was used as the first MOS transistor and a P type MOS transistor was used as the second MOS transistor; however, it is of course the case that the opposite conductivity types may be employed. In such case, the circuit would be one which amplified negative changes in the input signal and outputted these as large positive potential changes. Furthermore, an actual capacity was not provided for output capacity 1002, but rather, the input capacity of the subsequent stage circuit function equivalently as the output capacity of the circuit; however, it is of course the case that an actual capacity may be provided. Furthermore, a mechanism in which the gate potential of the N type MOS transistor 1003 was directly altered was adopted as the method for changing the gate/source voltage in the MOS transistor; however, other mechanisms may be employed, so that for example, a mechanism may b transistor 1007, which was connected with the drain electrode of the N type MOS transistor 1003, is altered via a capacity. In the resetting of the storage capacity 1001, junction 1005 was grounded, and junction 1008 was connected to the power source voltage $V_{DD}$; however, such a structure is not absolutely necessary, and appropriate voltages may be applied so that the absolute value of the gate/source potential in the respective MOS transistors is larger than the absolute value of the respective threshold values. Furthermore, a voltage which was half of the power source voltage was employed as the precharge voltage; however, it is of course the case that other voltages may be employed. Connection switches 1004 and 101 were inserted between the source electrode of the N type MOS transistor 1003 and the terminal 1005 of the storage capacity 1001, and between the drain electrode of the P type MOS transistor 1007 and the precharge power source $V_{PR}$; however, this was only done in order to prevent a current flow during the reset period, and the switches may be inserted on either the source side or the drain side of the MOS transistors, or the switches may be eliminated, so long as increases in power consumption resulting from the current flow may be ignored.

Figure 11:
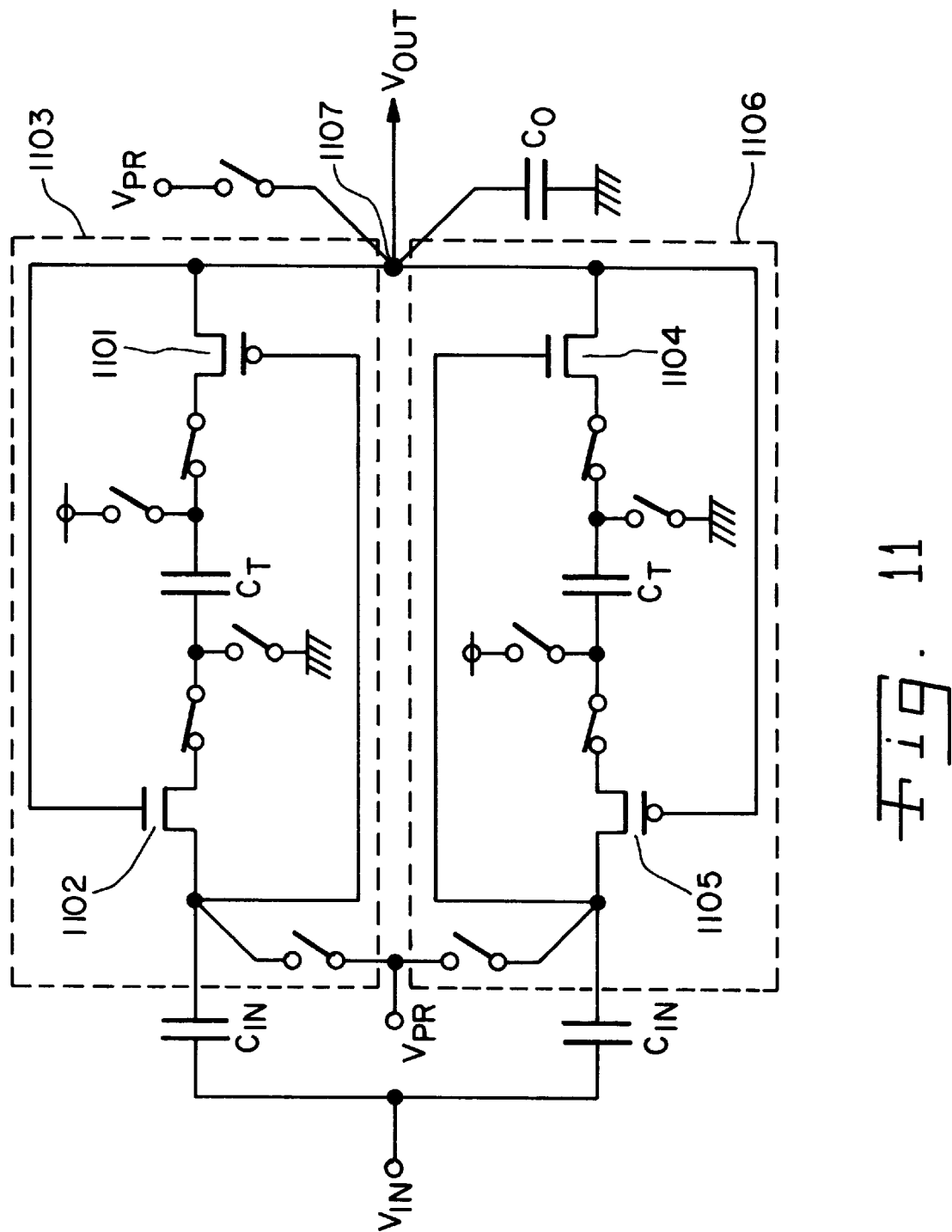
FIG. 11 is a circuit diagram showing the charge transfer positive feedback amplifier circuit of embodiment 6.

In embodiment six of the present invention, FIG. 11 is a schematic diagram of a circuit showing a sixth embodiment of the present invention. A first circuit 1103, having a double feedback loop employing a P type MOS transistor 1101 as the first MOS transistor and a N type MOS transistor 1102 as the second MOS transistor, and a second circuit 1106, having a double feedback loop employing a N type MOS transistor 1104 as the first MOS transistor and a P type MOS transistor 1105 as the second MOS transistor, are provided, and the drain electrode of the P type MOS transistor 1101 of the first circuit 1103 and the drain electrode of the N type MOS transistor 1104 of the second circuit 1106 are connected at a junction 1107 which forms the output terminal.

The detailed operation of the first circuit 1103 and the second circuit 1106 is identical to that described in embodiment 4, so that an explanation thereof will be omitted here. With respect to positive potential changes in the input in the amplification period, the second circuit 1106 operates, and changes the potential of the drain electrode of N type MOS transistor 1104, which servers as the output, by a large extent in the negative direction. At this time, the first circuit 1103 is non-responsive with respect to positive input signal changes, and the drain electrode of the P type MOS transistor 1101 which forms the output terminal is essentially electrically floating. Accordingly, the common output terminal 1107 is drawn to the second circuit, and a large negative output change is produced.

On the other hand, with respect to negative potential changes in the input in the amplification period, the first circuit 1103 operates, and alters the potential of the drain electrode of the P type MOS transistor 1101, which serves as the output, by a large extent in the positive direction. At this time, the second circuit 1106 is non-responsive with respect to negative input signal changes, so that the drain electrode of the N type MOS transistor 1104, which serves as the output terminal, is essentially electrically floating. Accordingly, the common output terminal 1107 is drawn to the first circuit, and large positive output change is produced.

In other words, the circuit of the present embodiment amplifies both positive and negative potential changes in the input signal in the amplification period and outputs an inverted signal with a large amplification.

As is clear from the circuit operation, a stationary direct current does not flow. Voltage amplification is thus possible having low power consumption.

Furthermore, even if the device parameters such as the threshold values, of the various MOS transistors within the first circuit 1103 and the second circuit 1106 fluctuate, there is no effect on the amplification operations. In other words, the circuit possesses the function of correcting variations in the element characteristics.

Figure 12:
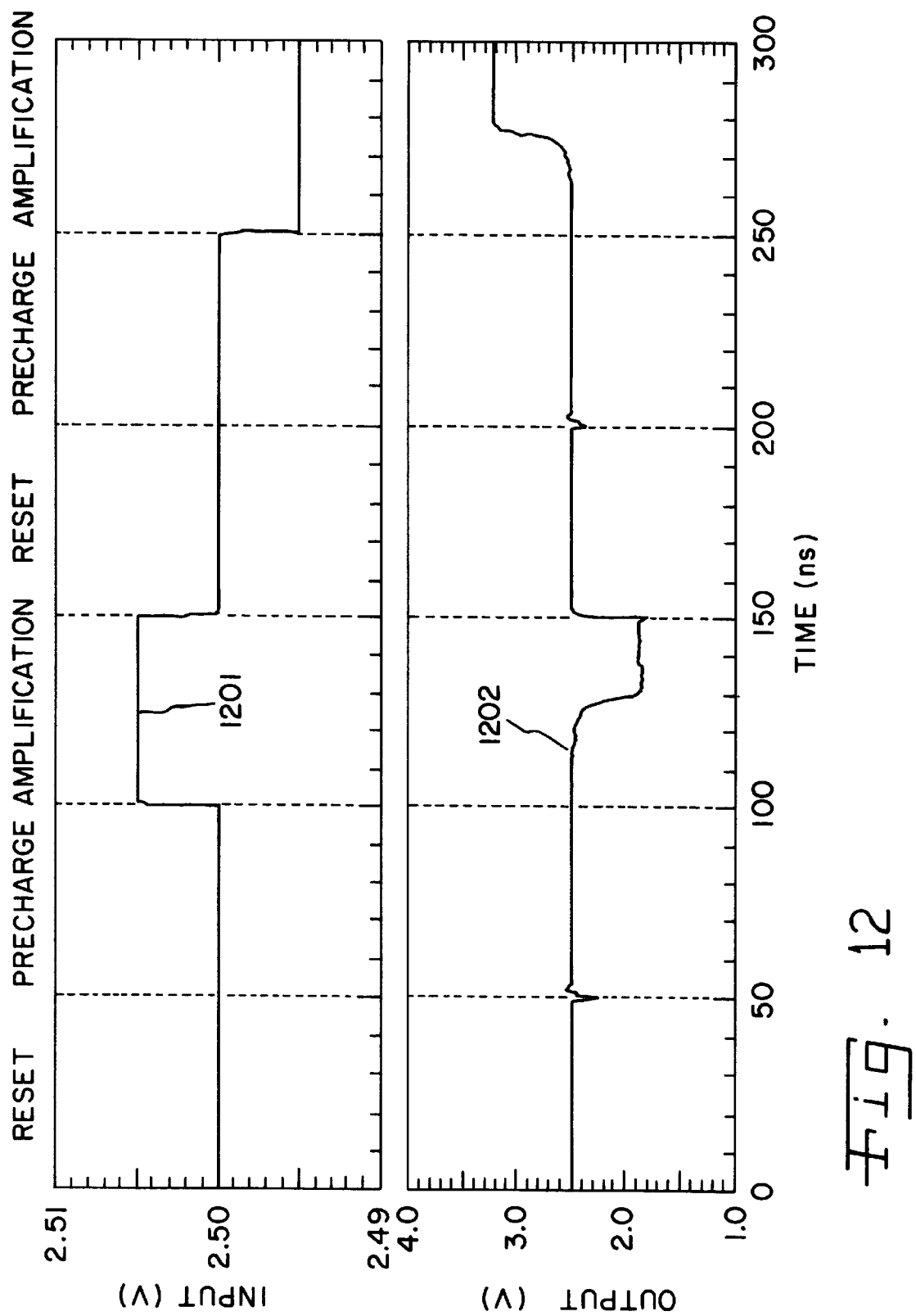
FIG. 12 is a graph showing the operational waveform of the charge transfer positive feedback amplifier circuit of embodiment 6.

FIG. 12 shows the operational waveform of the circuit of the present embodiment. Reference 1201 in the upper graph indicates the changes in potential of the input, while reference 1202 in the lower graph indicates changes in the potential of the output junction. During the first amplification period, the potential of the input is changed from a level of 2.5 V by +5 mV. By means of this, the N type MOS transistor 1104 of the second circuit 1106 is activated, charge transfer is initiated, and the potential of output junction 1107 is decreased. This change is transmitted to P type MOS transistor 1105, and this is greatly amplified by the feedback loop. Eventually, as shown by reference 1202, the potential of output junction 1107 changes greatly, by approximately −650 mV, and when the source/drain potential difference in the N type MOS transistor is eliminated, saturation is achieved. In the second amplification period, the potential of the input junction is changed from a level of 2.5 V by −5 mV. By means of this, the potential 1202 of the output junction changes greatly, by approximately +720 mV, and is then saturated. The amplification factor is thus greater than 100.

Figure 13:
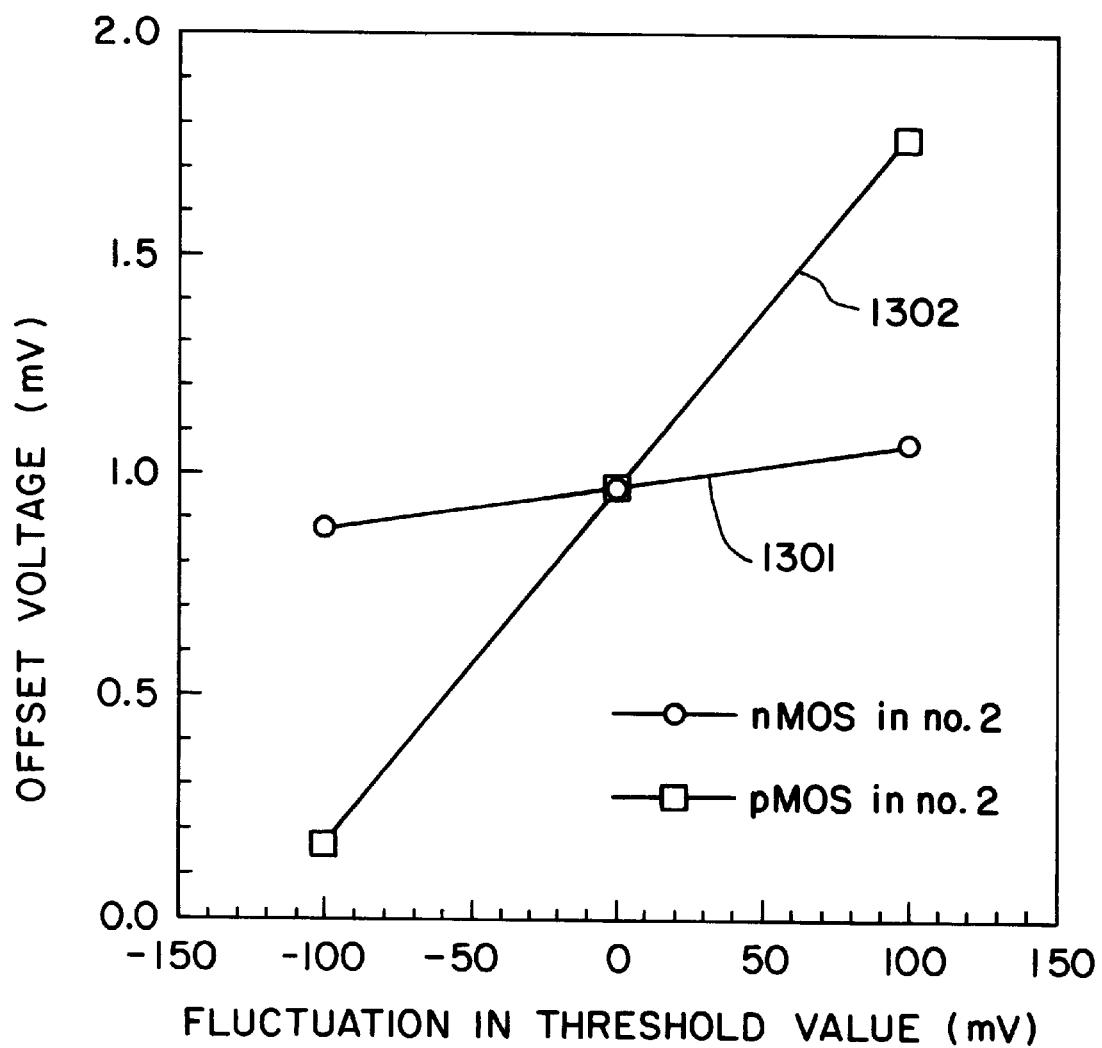
FIG. 13 is a graph showing the effects of fluctuations in the device characteristics with respect to the operation of the charge transfer positive feedback amplifier circuit of embodiment 6.

FIG. 13 shows the results of an investigation into the effects of fluctuations in device characteristics with respect to the operation of the CMOS charge transfer positive feedback amplifier of the present embodiment. Reference 1301 shows the fluctuations in the input offset voltage of the circuit when the threshold value $V_{THN}$ of the N type MOS transistor 1104 of the second circuit 1106 is fluctuated by ±100 mV. Here, the input offset voltage is a potential change which must be applied to the input junction in the amplification period in order to maintain the change in output potential at 0; ideally this voltage has a value of 0. However, in circuits in which a limited offset voltage is present as a result of the unbalanced state of the element characteristics within the circuit, and which do not possess a mechanism for correcting variations in the element characteristics, the input offset voltage also fluctuates as a result of variations in the element characteristics within the circuit. With reference to FIG. 13, the input offset voltage varies by a maximum of ±1 mV with respect to fluctuations in the threshold values of ±100 mV. It can thus be seen that the CMOS charge transfer positive feedback amplifier circuit of the present invention has the function of correcting fluctuations in the element characteristics.

In the present invention, circuits having a double feedback loop such as those described in the fourth embodiment were employed as the first circuit 1103 and the second circuit 1106; however, other circuits may be employed, and for example, circuits having the single feedback loop described in embodiment five may be employed. Furthermore, an actual capacity was not provided for the output capacity, but rather, the input capacity of the subsequent stage circuit functioned equivalently as the output capacity of the present circuit; however, it is of course the case that it is possible to provide an actual capacity. Furthermore, a mechanism which altered the gate potential of the P type MOS transistor 1101 of the first circuit 1103 via a capacity, and which altered the gate potential of the NMOS transistor 1104 of the second circuit 1104 of the second circuit 1106 via a capacity, was adopted as the method for altering the gate/source voltage of the MOS transistor; however, other mechanisms are possible, so that for example, a mechanism may be adopted in which an input signal is applied to the output terminal 1107 via a capacity, and the gate potential of the N type MOS transistor 1102 of the first circuit 1103 is altered, while the gate potential of the P type MOS transistor 1105 of the second circuit 1106 is altered. In the same way, the input terminal and output terminal may be switched. Furthermore, a common terminal may be provided which connects the drain electrode of N type MOS transistor 1102 of the first circuit 1103 with the drain electrode of the P type MOS transistor 1105 of the second circuit 1106.

In the present embodiment, the drain electrode of the P type MOS transistor 1101 of the first circuit 1103 and the drain electrode of the N type MOS transistor 1104 of the second circuit 1106 were directly connected at the junction 1107, and this was made a common output terminal; however, other output structures are possible, so that for example, coupling capacities may be disposed between the drain electrode of the P type MOS transistor 1101 of the first circuit 1103 and the junction 1107, and between the drain electrode of the N type MOS transistor 1104 of the second circuit 1106 and the junction 1107, and this capacitively connected output terminal may be employed.

Figure 14:
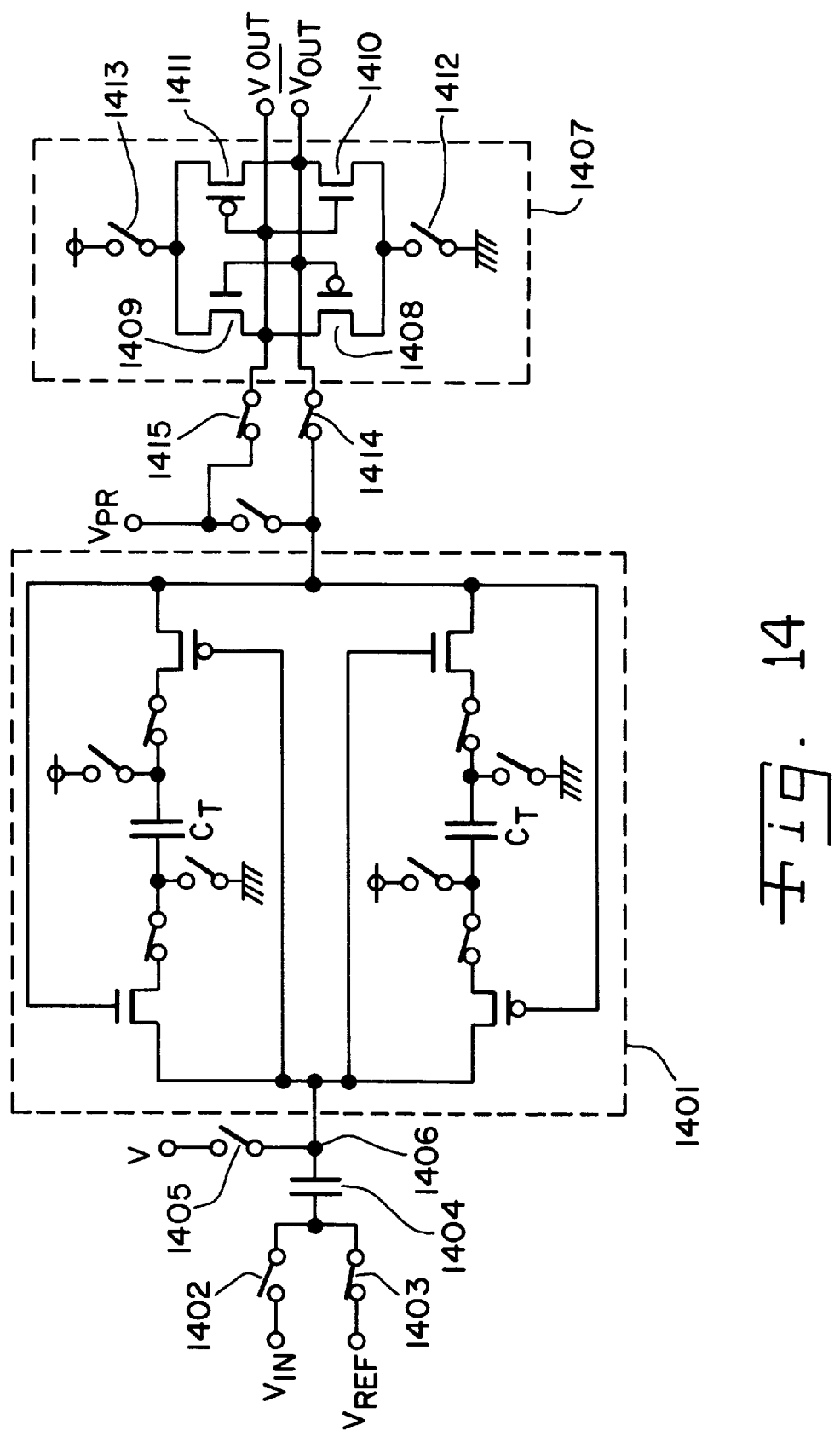
FIG. 14 is a circuit diagram showing the voltage comparator of the present invention.

In embodiment seven of the present invention, FIG. 14 is a schematic diagram of a circuit. This circuit is a voltage comparator in which a dynamic latch circuit is connected to the output of a charge transfer positive feedback amplifier circuit, and an input sampling circuit is connected to the input part thereof.

In FIG. 14, reference 1401 indicates a charge transfer positive feedback amplifier circuit, comprising a first circuit, having a double feedback loop employing a P type MOS transistor as the first MOS transistor and an N type MOS transistor as the second MOS transistor, and a second circuit having a double feedback loop employing a N type MOS transistor as the first MOS transistor and a P type MOS transistor of the second circuit are connected to form an input terminal, and the drain electrode of the P type MOS transistor of the first circuit and the drain electrode of the N type MOS transistor of the second circuit are connected to form an output terminal. Reference 1402 indicates a first input changeover switch, reference 1403 indicates a second input changeover switch, reference 1403 indicates a second input changeover switch, reference 1404 indicates an input sampling capacity, and reference 1405 indicates a precharge switch. Reference 1406 indicates the input terminal of the charge transfer positive feedback amplifier circuit 1401. Reference 1407 indicates a dynamic latch circuit. Within the dynamic latch circuit 1407, reference 1408 indicates a first N type MOS transistor, reference 1409 indicates a first P type MOS transistor, reference 1410 indicates a second N type MOS transistor, reference 1411 indicates a second P type MOS transistor, reference 1412 indicates a first latch control switch, and reference 1413 indicates a second latch control switch. Reference 1414 indicates a switch which controls the connection and disconnection of the output of the charge transfer positive feedback amplifier circuit 1401 and the input of the dynamic latch 1407. Reference 1415 indicates a switch which controls the connection and disconnection between the other input terminal of the dynamic latch 1407 and $V_{PR}$, which is employed as a reference voltage.

As was the case with the charge transfer positive feedback amplifier circuit 1401, dynamic latch 1407 also operates with three periods in one cycle, so that the comparator of the present invention, which combines these circuits, also operates in three periods.

In the first period, the resetting operation of the charge transfer positive feedback amplifier circuit 1401, and the latch operation of the dynamic latch 1407, are conducted. In other words, in dynamic latch 1407, switches 1414 and 1415 are placed in the OFF position, and the dynamic latch circuit is isolated. The latch control switches 1412 and 1413 within the dynamic latch circuit are placed in the ON position, and the signal which was inputted in the previous cycle is amplified, and the output is stabilized at either the ground potential or the power source potential.

In the second period, the precharging operation of the charge transfer positive feedback amplifier circuit 1401 and the resetting operation of the dynamic latch 1407 are conducted. At the same time, the input changeover switch 1402 is placed in an ON state, while switch 1403 is placed in an OFF position, and precharge switch 1405 is placed in the ON position. Accordingly, the input signal $V_{IN}$ of the comparator and the precharge voltage $V_{PR}$ are applied to the terminals of the input sampling capacity 1404. The precharge voltage $V_{PR}$ is applied to the input terminal 1406 of the charge transfer positive feedback amplifier 1401, that is to say, to the gate electrodes of the P type MOS transistor of the first circuit and the N type MOS transistor of the second circuit within the charge transfer positive feedback amplifier circuit, and the precharging of the charge transfer positive feedback amplifier circuit is conducted. Switches 1414 and 1415 are placed in the ON position, while latch control switches 1412 and 1413 within the dynamic latch 1407 are placed in the OFF position, and both input terminals of the dynamic latch are reset using precharge voltage $V_{PR}$.

In the third period, the amplification operation of the charge transfer positive feedback amplifier circuit 1401, and the input transfer operation of the dynamic latch 1407, are conducted. First, precharge switch 1405 is placed in the OFF position, and the input terminal 1406 of the charge transfer positive feedback amplifier circuit 1401 is placed in a floating state. In put changeover switch 1402 is placed in an OFF state, while switch 1402 is placed in the ON position, and this results in the application of reference voltage $V_{REF}$ to the input sampling capacity 1404. At this time, the difference in potential between this reference voltage $V_{REF}$ and the input signal $V_{IN}$ applied in the second period is capacitively divided by the input sampling capacity 1404 and the input capacity of the charge transfer positive feedback amplifier circuit, and this appears in input terminal 1406 as a change in potential. If the capacity of input sampling capacity 1404 is set so as to be sufficiently large in comparison with the input capacity of the charge transfer positive feedback amplifier circuit, then a potential change is produced which is essentially identical to the difference in potential between the reference signal $V_{REF}$ and the input signal $V_{IN}$. Voltage amplification is conducted within charge transfer positive feedback amplifier circuit 1401 as a result of the change in potential of the input terminal, and the output thereof is transmitted to one of the input terminals of dynamic latch 1407 via switch 1414. The precharge voltage is continuously applied to the other input terminal via switch 1415, so that a difference in potential is produced between the two input terminals of the dynamic latch 1407. In the first period of the subsequent cycle, this difference in potential is amplified via the latch function of the dynamic latch, and the larger of the input signal $V_{IN}$ and the reference voltage $V_{REF}$ is outputted.

By repeating cycles comprised of these three periods, it is possible to conduct voltage comparison in a cyclically continuous manner.

As was shown in the previous embodiment, the charge transfer positive feedback amplifier circuit is capable of conducting voltage amplification without being affected by fluctuations in element characteristics. Accordingly, even if an input offset voltage is present in the dynamic latch, and this varies from circuit to circuit, the voltage comparator of the present embodiment, to which is connected, as a prestage, the charge transfer positive feedback amplifier circuit, is capable of effectively reducing the variation in the input offset voltage, so that a high comparison accuracy can be obtained. This may be applied to a high resolution A/D converter.

Furthermore, a stationary current does not flow in either the charge transfer positive feedback amplifier circuit 1401 of the dynamic latch 1407, so that the voltage comparator of the present embodiment has extremely small power consumption.

In the present embodiment, a charge transfer positive feedback amplifier circuit was employed which was provided with feedback amplifier circuit was employed which was employed which was provided with a first circuit, having a double feedback loop employing a P type MOS transistor as the first MOS transistor and a N type MOS transistor as the second MOS transistor, and a second circuit, having a double feedback loop employing a N type MOS transistor as the first MOS transistor of the first circuit and the drain electrode of the P type MOS transistor of the second circuit were connected to form an input terminal, and the drain electrode of the P type MOS transistor of the first circuit and the drain electrode of the N type MOS transistor of the second circuit were connected to form an output terminal; however, other charge transfer positive feedback amplifier circuits may also be employed, so that for example, it is possible to employ a charge transfer positive feedback amplifier circuit which is provided with a first circuit, having a single feedback loop employing a P type MOS transistor as the first MOS transistor and an N type MOS transistor as the second MOS transistor, and a second circuit, having a single feedback loop employing a N type MOS transistor as the first MOS transistor and a P type MOS transistor as the second MOS transistor, wherein the drain electrode of the P type MOS transistor of the first circuit and the drain electrode of the N type MOS transistor of the second circuit are connected to form an output terminal, or alternatively, it is of course the case that the charge transfer positive feedback amplifier circuit shown in embodiment three, or the like may be employed. Furthermore, a typical dynamic latch circuit in which a stationary current did not flow was employed as the latch circuit; however, other such circuits may be employed, so that for example, a current control type latch sense amplifier circuit, or a typical latch circuit of an inverter bound type, may be employed. Furthermore, in the present embodiment, the input signal $V_{IN}$ was applied to the input sampling capacity 1404 in the second period, while the reference $V_{REF}$ was applied in the third period; however, depending on the use, the order of this may be reversed. The signal applied to the input sampling capacity 1404 in the first period may be either the input signal $V_{IN}$ or the reference signal $V_{REF}$, or alternatively, no signal may be applied.

Figure 15:
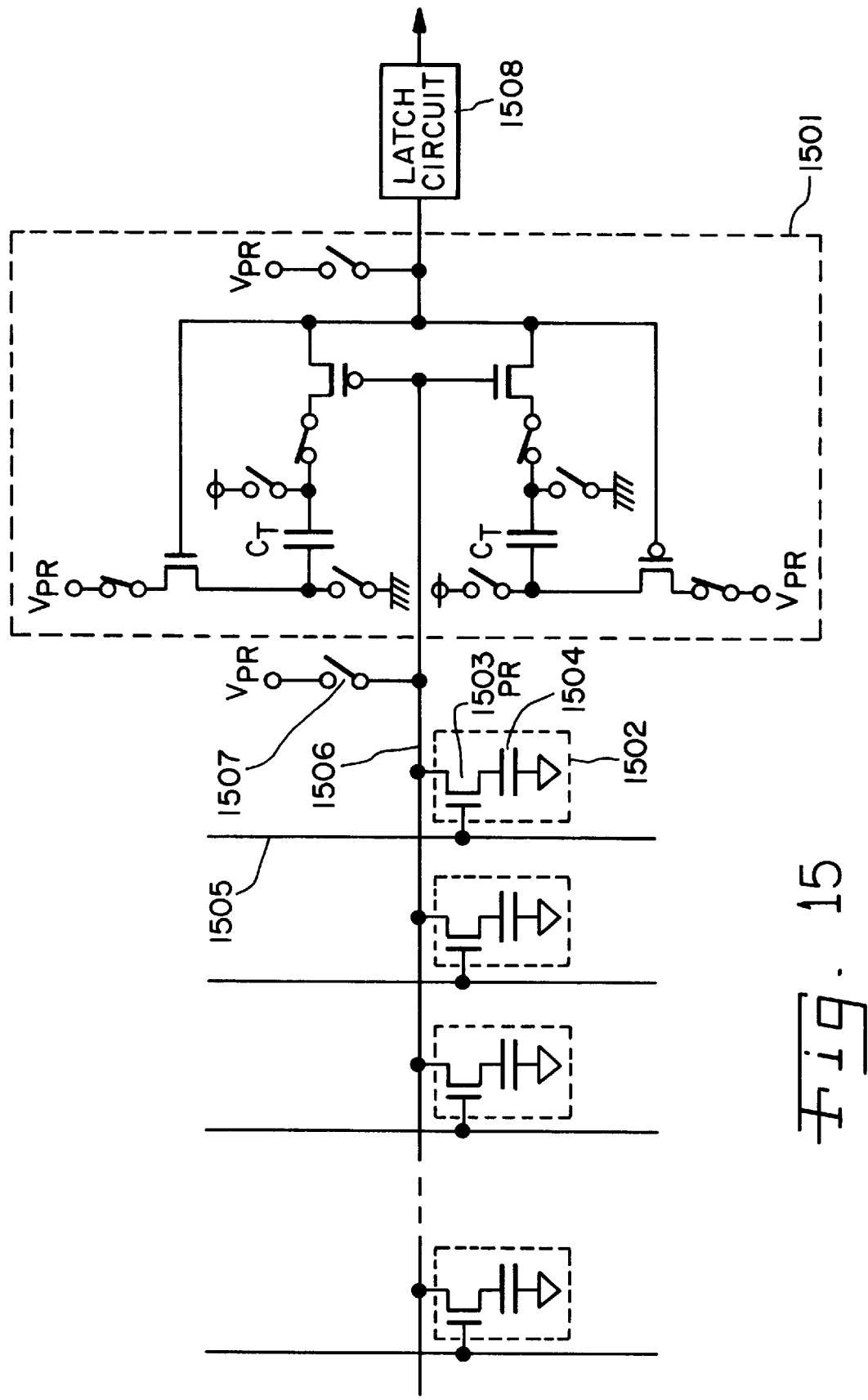
FIG. 15 is a circuit diagram showing the sense amplifier of the present invention.

FIG. 15 is a schematic diagram of a circuit showing an eight embodiment of the present invention. This circuit has the form of a sense amplifier circuit employing a charge transfer positive feedback amplifier circuit having as the input thereof a bit line in which a plurality of memory elements are connected, which amplifies the extremely small potential changes in the bit line by means of the selected memory element data, and outputs these.

In FIG. 15, reference 1501 indicates a charge transfer positive feedback amplifier circuit, which is provided with a first circuit, having a single feedback loop employing a P type MOS transistor as the first MOS transistor and an N type MOS transistor as the second MOS transistor, and a second circuit, having a single feedback loop employing a N type MOS transistor as the first MOS transistor and a P type MOS transistor as the second MOS transistor, wherein the drain electrode of the P type MOS transistor of the first circuit and the drain electrode of the N type MOS transistor of the second circuit are connected to one another to form an output terminal. the gate electrode of the P type MOS transistor of the first circuit and the gate electrode of the N type MOS transistor of the second circuit are connected to form an input terminal. Reference 1502 indicates a dynamic memory cell; this comprises a MOS transistor switch 1503 and a storage capacity 1504. The gate electrode of the MOS transistor switch 1503 and a storage capacity 1504. The gate electrode of the MOS transistor switch 1503 is connected to word line 1505. Reference 1506, to which a plurality of memory cells are connected, indicates the bit line; this is connected with the input terminal of the charge transfer positive feedback amplifier circuit 1501. The bit line has a structure in which appropriate precharging is conducted via a precharge switch 1507. the output of the charge transfer positive feedback amplifier circuit is connected to the latch circuit 1508, and ultimately a digital signal is outputted. The details of the operation of th charge transfer positive feedback amplifier circuit 1501 are identical to those in the previous embodiments, so that an explanation thereof will be omitted here.

In the precharge period of the charge transfer positive feedback amplifier circuit 1501, the precharge switch 1507 of the bit line 1506 is place in the ON position, and the bit line 1506 is precharged with a precharge voltage $V_{PR}$ which is set to half of the power source voltage.

Next, in accordance with the timing at which the charge transfer positive feedback amplifier circuit transfers to the amplification period, the precharge switch 1507 is placed in the OFF position, and a word line connected to one of the plurality of memory cells connected to the bit line 1506 is activated, the MOS transistor switch within the cell is placed in an ON state, and the storage capacity and the bit line 1506 are connected. When a charge is not stored in advance in the storage capacity (the case in which a value of 0 is written thereinto) the charge flows from bit line 1506 as a result of the ON state of the MOS transistor switch. charge distribution takes place between the storage capacity and the extremely large attendant parasitic capacity of bit line 1506, so that the potential is inputted into charge transfer positive feedback amplifier circuit 1501, and this is inverted and amplified by the positive feedback, and is outputted as an extremely large positive signal change, and by means of the latch circuit 1508 which is connected to the following stage of the charge transfer positive feedback amplifier circuit, a value of 1 is latched as a digital signal, and the contents of the selected memory cell are read out as an inverted signal.

On the other hand, when the storage capacity is charged in advance with the power source voltage and a charge is stored (the case in which a value of 1 is written thereinto), charge flows from the storage capacity into bit line 1506 as a result of the ON state of the MOS transistor switch. Charge distribution takes place between the storage capacity and the extremely large attendant parasitic capacity of the bit line 1506, and the potential of the bit line 1506 increases slightly. This change in potential is inputted into charge transfer positive feedback amplifier circuit 1501, and this is inverted and amplified by positive feedback, and is outputted as an extremely large negative signal change, and by means of the latch circuit 1508 which is connected to the following stage of the charge transfer positive feedback amplifier circuit, a value of 0 is latched as a digital signal, and the contents of the selected memory cell are read out as an inverted signal.

As described in the present embodiment, by employing the charge transfer positive feedback amplifier circuit as a sense amplifier, it is possible to amplify extremely small potential changes in the bit line to extremely large voltages rapidly, and with high accuracy, and it is also possible to minimize the power consumed.

In the present embodiment, a charge transfer positive feedback amplifier circuit was employed which was provided with a first circuit, having a single feedback loop employing a P type MOS transistor as the first MOS transistor and an N type MOS transistor as the second MOS transistor, and a second circuit, having a single feedback loop employing a N type MOS transistor as the first MOS transistor and a P type MOS transistor as the second MOS transistor, wherein the drain electrode of the P type MOS transistor of the first circuit and the drain electrode of the N type MOS transistor of the second circuit were connected to one another to form an output terminal; however, other charge transfer positive feedback amplifier circuits depicted in embodiments 6 and 7 may be employed. Furthermore, a power source having a voltage which was half of that of the power source voltage was employed as the precharge power source of the charge transfer positive feedback amplifier circuit and the bit line' however, it is of course the case that other voltages may be employed. Dynamic memory cells comprising a storage capacity and a switch MOS transistor were used as examples of the memory cells; however, memory cells having other structures may be employed, so that for example, static memory cells or non-volatile memory cells may be employed.

Figure 16:
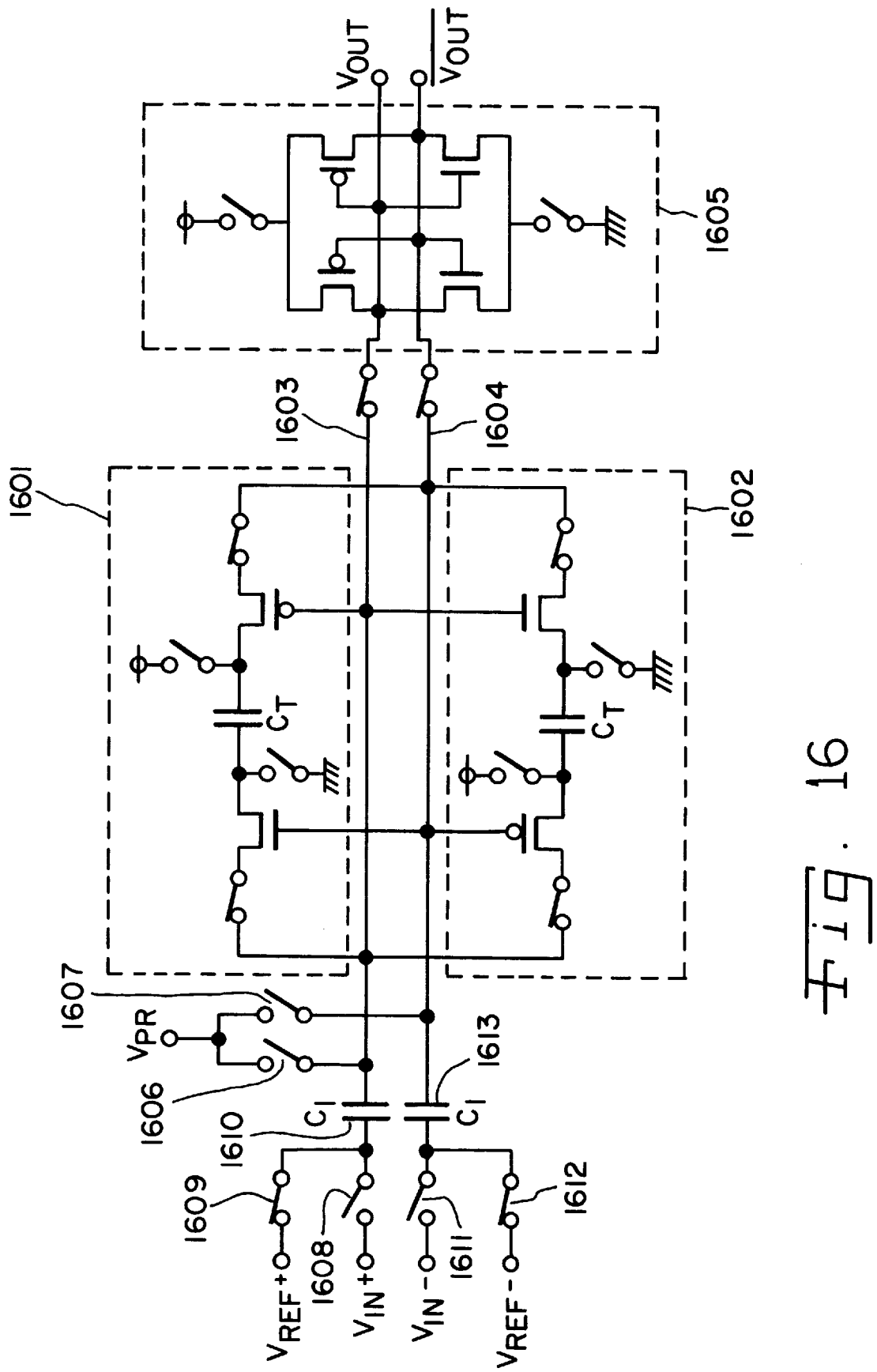
FIG. 16 is a circuit diagram showing the charge transfer positive feedback amplifier circuit of embodiment 9.
Figure 17:
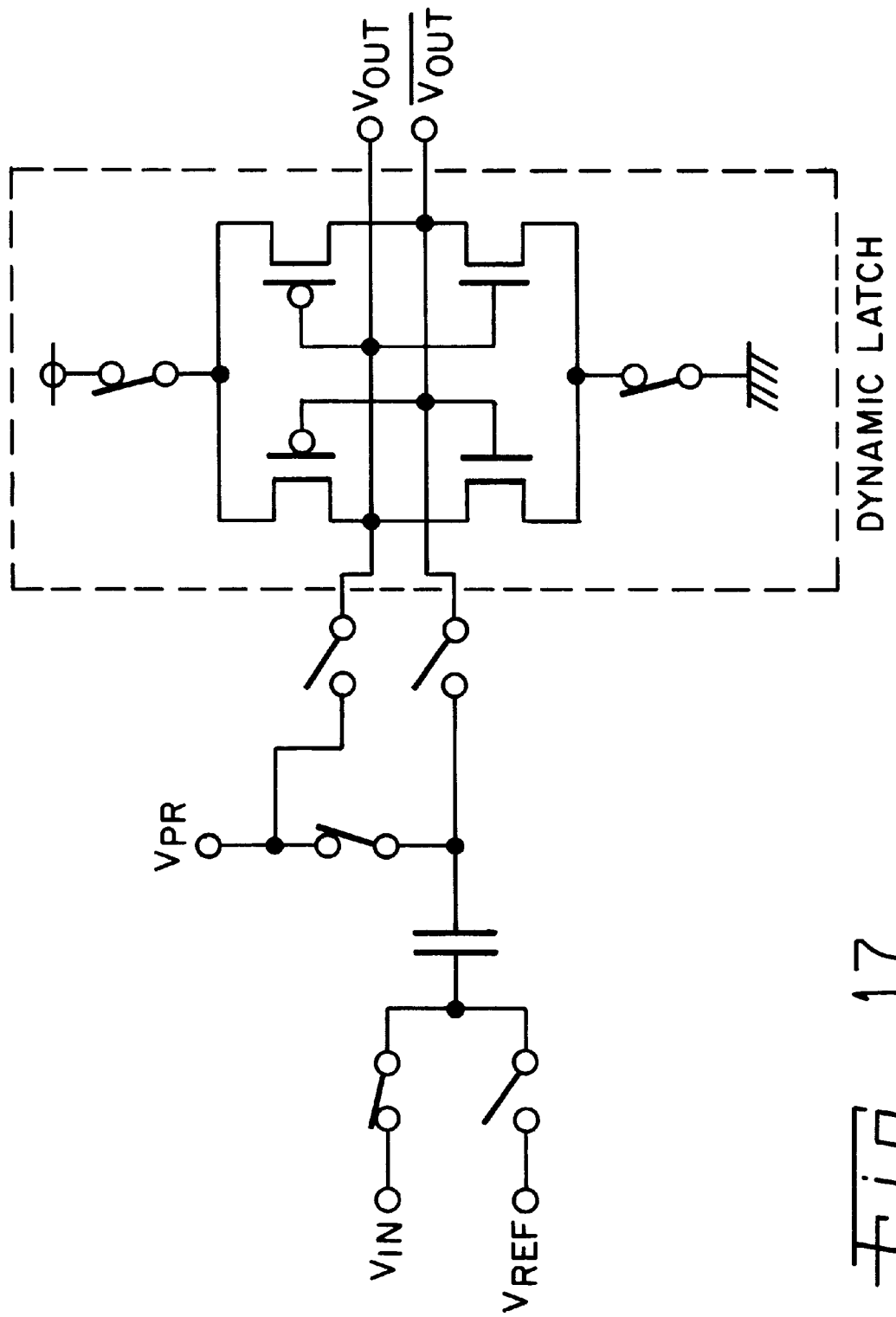
FIG. 17 is a circuit showing a conventional dynamic latch voltage comparator.

FIG. 16 is a schematic diagram of a circuit showing a ninth embodiment of the present invention. This circuit is a voltage comparator constructed so that charge transfer positive feedback amplifier circuits are arranged in a symmetrical structure to improve the accuracy, a dynamic latch circuit is connected, and an input sampling circuit is connected to the input part thereof.

The charge transfer positive feedback amplifier circuit depicted in embodiment 7 (FIG. 14) can be seen as a circuit in which the unipolar charge transfer positive feedback amplifier circuits (in which the polarity of the changes in the inputted voltage is limited to either positive or negative) shown in embodiment 4 (FIG. 9) are arranged on the left and right in inverted fashion and combined. In other words, the circuit is one in which the input and output of the first unipolar charge transfer amplifier circuit are connected to the output and input, respectively, of the second unipolar charge transfer amplifier circuit. Additionally, among the two junctions connecting the two unipolar charge transfer amplifier circuits, one is seen as the input and the other is seen as the output, and an input sampling circuit is connected to the input side, while a dynamic latch circuit is connected to the output side. Ultimately, the two junctions at which the input and output of the unipolar charge transfer amplifier circuits are connected in inverted fashion are equivalent, so that it makes no difference which is used as the input or the output. In other words, there is no need to distinguish the input from the output.

In the present embodiment, a differential type charge transfer amplifier circuit, in which a pair of junctions are used as common input and output junctions, is provided.

In FIG. 16, references 1601 and 1602 indicate unipolar charge transfer amplifier circuits; these are coupled in a complementary manner with respect to differential junctions 1603 and 1604. In the present embodiment, in the unipolar charge transfer amplifier circuits, unlike in embodiments 4 and 7, the connection switches serving to prevent current flow are provided on the drain side of the MOS transistors. Reference 1605 indicates the dynamic latch circuit which was also employed in embodiment 7. References 1606 and 1607 indicate precharge switches which connect, respectively, the differential junctions 1603 and 1604 with the precharge power source $V_{PR}$. References 1608 and 1609 indicate input changeover switches which serve to transmit the input signal $V_{IN}+$ and the reference signal $V_{REF}+$ to the differential junction 1603 via the first input sampling capacity 1610. References 1611 and 1612 are input changeover switches which serve to transmit the inverted input signal $V_{IN}-$ and the inverted reference signal $V_{REF}-$ to differential junction 1604 via the second input sampling capacity 1613. Input changeover switches 1611 and 1608 operate in the same phase, and switches 1612 and 1609 operate in the same phase. The rest of the circuit structure, and the details of the operation, are identical to those given in embodiment 7, so that an explanation thereof will be omitted here.

In the present embodiment, the circuit structure is completely symmetrical with respect to the two differential junctions 1603 and 1604. Accordingly, it is possible to prevent the overall shift in the offset voltage produced in embodiment 6 (in the graph in FIG. 13 of the fluctuations in the offset voltage of the charge transfer positive feedback amplifier circuit which result from fluctuations in the threshold value of the MOS transistors, indicated by reference 1302, the offset voltage of approximately 0.95 mV when the fluctuations of the threshold value of the MOS transistors had a value of 0; this is produced because the current/voltage characteristics of the P type MOS transistor and N type MOS transistor are not completely symmetrical, and as an effect thereof; differing effects are imparted to the input and output junctions, which are not symmetrical with respect to the charge transfer positive feedback amplifier circuit), and this enables an increase in the accuracy of the charge transfer positive feedback amplifier circuit.

In the present invention, in the unipolar charge transfer amplifier circuits, the connection switches which serve to prevent current flow are provided on the drain side of the MOS transistors; however, it is of course the case that these switches may be provided on the source side of the MOS transistors, as was the case in embodiments 4 and 7. Furthermore, typical dynamic latch circuits, in which stationary currents did not flow, were employed as the latch circuit; however, other such circuits may be employed, so that for example, current control type latch sense amplifier circuits or typical latch circuits of the inverter bound type or the like, may be employed.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A charge transfer amplifier circuit, comprising:
   a MOS transistor having a gate, source and drain electrode;
   a first capacitor and a second capacitor which are respectively connected with said source electrode and drain electrode of said MOS transistor;
   means for setting the region between the terminals of said first capacitor and the region between the terminals of said second capacitor to a respective predetermined potential difference, and for releasing the respective predetermined potential difference of said first capacitor and said second capacitor; and
   means for externally altering the potential difference between said gate and source electrodes of said MOS transistor, said first capacitor set so as to be larger than said second capacitor.

2. A charge transfer amplifier circuit comprising:
   a first circuit, having a PMOS transistor with a gate, source and drain electrode, a first capacitor having terminals, said first capacitor which is connected with said source electrode of the PMOS transistor, a first means for setting the region between the terminals of said first capacitor to a predetermined potential difference, and for releasing said predetermined potential difference set by said first means, and a means for appropriately externally altering the potential difference between the gate electrode and the source electrode of said PMOS transistor, and
   a second circuit, having a NMOS transistor with a gate, source and drain electrode, a second capacitor having terminals which is effectively connected to the source electrode of said NMOS transistor, a second means for setting the region between the terminals of said second capacitor to an appropriate predetermined potential difference and for releasing said predetermined potential difference set by said second means, and a means for appropriately externally altering the potential difference between the gate electrode and the source electrode of said NMOS transistor;
   said first circuit and said second circuit are connected at the drain electrodes of said PMOS transistor and said NMOS transistor, a third means is provided for setting the region between the terminals of a third capacitor, which is effectively connected to these drain electrodes, to an appropriate predetermined potential difference, and for releasing said predetermined potential difference set by said third means, wherein each of said first capacitor of said first circuit and said second capacitor of said second circuit being larger than said third capacitor.

3. A charge transfer amplifier circuit in accordance with claim 2, wherein the gate electrode of said P type MOS transistor and the gate electrode of said N type MOS transistor are connected, and form a common terminal.

4. A charge transfer amplifier circuit in accordance with claim 1, wherein said means for appropriately externally altering the potential difference between the gate electrode and the source electrode of said MOS transistor has a means for altering the potential of the gate electrode of said MOS transistor.

5. A charge transfer amplifier circuit in accordance with claim 2, wherein at least one of said means for altering the potential difference between the gate electrode and the source electrode of said PMOS transistor and said means for altering the potential difference between the gate electrode and the source electrode of said NMOS transistor includes a respective means for altering the Potential of the gate electrode of the respective MOS transistor associated therewith.

6. A charge transfer amplifier circuit in accordance with claim 3, wherein at least one of said means for altering the potential difference between the gate electrode and the source electrode of said PMOS transistor and said means for altering the potential difference between the gate electrode and the source electrode of said NMOS transistor includes a respective means for altering the potential of the gate electrode of the respective MOS transistor associated therewith.

7. A charge transfer positive feedback amplifier circuit, which is provided with:
   a first MOS transistor;
   a second MOS transistor, which is of the opposite conductivity type to said first MOS transistor;
   a storage capacity, which is connected between the source electrode of said first MOS transistor and the source electrode of said second MOS transistor;
   a means for setting both terminals of said storage capacity to an appropriate predetermined potential in a reset period;
   a means for connecting the gate electrode of said second MOS transistor and the drain electrode of said first MOS transistor, a means for setting the drain electrode of said first MOS transistor to an appropriate predetermined potential in a precharge period which follows the reset period, and for releasing this in an amplification period following said precharge period;
   a means for connecting the gate electrode of said first MOS transistor and the drain electrode of said second MOS transistor, and a means for setting the drain electrode of said second MOS transistor to an appropriate predetermined potential in said precharge period and releasing this in said amplification period; and
   a mechanism for altering one of the gate/source voltage of said first MOS transistor and the gate/source voltage of said second MOS transistor in response to an input signal, the voltage of which changes, in said amplification period.

8. A charge transfer positive feedback amplifier circuit comprising:
   a first charge transfer positive feedback amplifier circuit in accordance with claim 7, wherein said first MOS transistor is a P type MOS transistor, and a second charge transfer positive feedback amplifier circuit in accordance with claim 7, wherein said first MOS transistor comprises a N type MOS transistor;
   wherein the drain electrode of the P type MOS transistor of said first charge transfer positive feedback amplifier circuit and the drain electrode of the N type MOS transistor of said second charge transfer positive feedback amplifier circuit are connected, and the drain electrode of the N type MOS transistor of said first charge transfer positive feedback amplifier circuit and the drain electrode of the P type MOS transistor of said second charge transfer positive feedback amplifier circuit are connected.

9. A voltage comparator, comprising:

an input circuit having an output end;

a charge transfer amplifier circuit having an input end and an output end, the input end of said amplifier circuit being operatively coupled to the output end of said input circuit; and a dynamic latch circuit having an input end and an output end, the input end of said dynamic latch circuit being operatively coupled to the output end of said charge transfer amplifier circuit;

said charge transfer amplifier circuit comprising:

a MOS transistor having a gate, source and drain electrode, the gate electrode being operatively coupled at the input end of said amplifier circuit to the output end of said input circuit, the drain electrode being operatively coupled at the output end of said amplifier circuit to the input end of said dynamic latch circuit, a capacitor connected with said source electrode of said MOS transistor, and a means for setting the region between the terminals of said capacitor to a predetermined potential difference, and for releasing said predetermined potential difference;

said input circuit including a means for selectably altering the potential difference between the gate electrode and the source electrode of said MOS transistor.

10. A voltage comparator, comprising:

an input circuit having an output end;

a charge transfer amplifier circuit having an input end and an output end, the input end of said amplifier circuit being operatively coupled to the output end of said input circuit; and a dynamic latch circuit having an input end and an output end, the input end of said dynamic latch circuit being operatively coupled to the output end of said charge transfer amplifier circuit;

said charge transfer amplifier circuit comprising:

a first circuit having a PMOS transistor with a gate, source and drain electrode, the gate electrode of said PMOS transistor being operatively coupled at the input end of said amplifier circuit to the output end of said input circuit, the drain electrode of said PMOS transistor being operatively coupled at the output end of said amplifier circuit to the input end of said dynamic latch circuit, said first circuit further including a first capacitor having terminals, said first capacitor being connected with the source electrode of said PMOS transistor, and a first means for setting the region between the terminals of said first capacitor to a predetermined potential difference and for releasing the predetermined potential difference set by said first means, and a second circuit having a NMOS transistor with a gate, source and drain electrode, the gate electrode of said NMOS transistor being operatively coupled at the input end of said amplifier circuit to the output end of said input circuit, the drain electrode of said NMOS transistor being operatively coupled at the output end of said amplifier circuit to the input end of said dynamic latch circuit, said second circuit further including a second capacitor having terminals, said second capacitor being connected with the source electrode of said NMOS transistor, and a second means for setting the region between the terminals of said second capacitor to a predetermined potential difference and for releasing the predetermined potential difference set by said second means, said first circuit and said second circuit being connected at the respective drain electrodes of said PMOS transistor and said NMOS transistor;

said input circuit including a means, operatively associated with said first circuit and said second circuit, for appropriately selectably altering the potential difference between the gate electrode and the source electrode of said PMOS transistor and for appropriately selectably altering the potential difference between the gate electrode and the source electrode of said NMOS transistor.

11. A voltage comparator, comprising:

an input circuit having an output end;

a charge transfer amplifier circuit having an input end and an output end, the input end of said amplifier circuit being operatively coupled to the output end of said input circuit; and a dynamic latch circuit having an input end and an output end, the input end of said dynamic latch circuit being operatively coupled to the output end of said charge transfer amplifier circuit;

said charge transfer amplifier circuit comprising:

a first circuit having a PMOS transistor with a gate, source and drain electrode, the gate electrode of said PMOS transistor being operatively coupled at the input end of said amplifier circuit to the output end of said input circuit, the drain electrode of said PMOS transistor being operatively coupled at the output end of said amplifier circuit to the input end of said dynamic latch circuit, said first circuit further including a first capacitor having terminals, said first capacitor being connected with the source electrode of said PMOS transistor, and a first means for setting the region between the terminals of said first capacitor to a predetermined potential difference and for releasing the predetermined potential difference set by said first means, and a second circuit having a NMOS transistor with a gate, source and drain electrode, the gate electrode of said NMOS transistor being operatively coupled at the input end of said amplifier circuit to the output end of said input circuit, the drain electrode of said NMOS transistor being operatively coupled at the output end of said amplifier circuit to the input end of said dynamic latch circuit, said second circuit further including a second capacitor having terminals, said second capacitor being connected with the source electrode of said NMOS transistor, and a second means for setting the region between the terminals of said second capacitor to a predetermined potential difference and for releasing the predetermined potential difference set by said second means, said first circuit and said second circuit being connected at the respective drain electrodes of said PMOS transistor and said NMOS transistor, the gate electrode of said PMOS transistor and the gate electrode of said NMOS transistor being connected together to form a common terminal;

said input circuit including a means, operatively associated with said first circuit and said second circuit, for appropriately selectably altering the potential difference between the gate electrode and the source electrode of said PMOS transistor and for appropriately selectably altering the potential difference between the gate electrode and the source electrode of said NMOS transistor.

12. A voltage comparator, comprising:

an input circuit having an output end;

a charge transfer amplifier circuit having an input end and an output end, the input end of said amplifier circuit being operatively coupled to the output end of said input circuit; and a dynamic latch circuit having an input end and an output end, the input end of said dynamic latch circuit being operatively coupled to the output end of said charge transfer amplifier circuit;

said charge transfer amplifier circuit comprising:

a MOS transistor having a gate, source and drain electrode, the gate electrode being operatively coupled at the input end of said amplifier circuit to the output end of said input circuit, the drain electrode being operatively coupled at the output end of said amplifier circuit to the input end of said dynamic latch circuit, a capacitor connected with said source electrode of said MOS transistor, and a means for setting the region between the terminals of said capacitor to a predetermined potential difference, and for releasing said predetermined potential difference;

said input circuit including a means for selectably altering the potential difference between the gate electrode and the source electrode of said MOS transistor, said potential difference altering means including a means for selectably altering the potential of the gate electrode of said MOS transistor.

13. A voltage comparator, comprising:

an input circuit having an output end;

a charge transfer positive feedback amplifier circuit having at least a first circuit junction and a second circuit junction, one of the first circuit junction and the second circuit junction serving as an input for said amplifier circuit while another of the first circuit junction and the second circuit junction serving as an output for said amplifier circuit;

a dynamic latch circuit having an input end and an output end;

one of the first circuit junction and the second circuit junction being operatively coupled to the output end of said input circuit while another of the first circuit junction and the second circuit junction being operatively coupled to the input end of said dynamic latch circuit;

said charge transfer positive feedback amplifier circuit comprising:

a first MOS transistor, a second MOS transistor, which is of the opposite conductivity type to said first MOS transistor, a storage capacity, which is connected between the source electrode of said first MOS transistor and the source electrode of said second MOS transistor, a means for setting both terminals of said storage capacity to an appropriate predetermined potential in a reset period, a means for connecting the gate electrode of said second MOS transistor and the drain electrode of said first MOS transistor, a means for connecting the gate electrode of said first MOS transistor and the drain electrode of said second MOS transistor, a first means, operatively coupled to one of the first circuit junction and the second circuit junction, for setting the drain electrode of said first MOS transistor to an appropriate predetermined potential in a precharge period which follows the reset period, and for releasing the predetermined potential set by said first means in an amplification period following said precharge period, and a second means, operatively coupled to another of the first circuit junction and the second circuit junction, for setting the drain electrode of said second MOS transistor to an appropriate predetermined potential in said precharge period, and for releasing the predetermined potential set by said second means in said amplification period;

said input circuit including a mechanism for selectably altering one of the gate/source voltage of said first MOS transistor and the gate/source voltage of said second MOS transistor in response to an input signal, the voltage of which changes, in said amplification period.

14. A voltage comparator, comprising:

an input circuit having an output end;

a circuit assembly having at least a first circuit junction and a second circuit junction, one of the first circuit junction and the second circuit junction serving as an input for said circuit assembly while another of the first circuit junction and the second circuit junction serving as an output for said circuit assembly, said circuit assembly including a first charge transfer positive feedback amplifier circuit and a second charge transfer positive feedback amplifier circuit;

a dynamic latch circuit having an input end and an output end;

one of the first circuit junction and the second circuit junction being operatively coupled to the output end of said input circuit while another of the first circuit junction and the second circuit junction being operatively coupled to the input end of said dynamic latch circuit;

each respective one of said first charge transfer positive feedback amplifier circuit and said second charge transfer positive feedback amplifier circuit respectively comprising:

a first MOS transistor, a second MOS transistor, which is of the opposite conductivity type to said first MOS transistor, a storage capacity, which is connected between the source electrode of said first MOS transistor and the source electrode of said second MOS transistor, a means for setting both terminals of said storage capacity to an appropriate predetermined potential in a reset period, a means for connecting the gate electrode of said second MOS transistor and the drain electrode of said first MOS transistor, and a means for connecting the gate electrode of said first MOS transistor and the drain electrode of said second MOS transistor;

the first MOS transistor of said first charge transfer positive feedback amplifier circuit including a P-type MOS transistor, and the first MOS transistor of said second charge transfer positive feedback amplifier circuit including an N-type MOS transistor;

wherein the drain electrode of the P-type MOS transistor of said first charge transfer positive feedback amplifier circuit and the drain electrode of the N-type MOS transistor of said second charge transfer positive feedback amplifier circuit are connected at one of the first circuit junction and the second circuit junction, and the drain electrode of the N-type MOS transistor of said first charge transfer positive feedback amplifier circuit and the drain electrode of the P-type MOS transistor of said second charge transfer positive feedback amplifier circuit are connected at another of the first circuit junction and the second circuit junction;

a first means, operatively coupled to one of the first circuit junction and the second circuit junction, for setting the respective drain electrodes of the respective first MOS transistors of said first charge transfer positive feedback amplifier circuit and said second charge transfer positive feedback amplifier circuit to an appropriate predetermined potential in a precharge period which follows the reset period, and for releasing the predetermined potential set by said first means in an amplification period following said precharge period;

and a second means, operatively coupled to another of the first circuit junction and the second circuit junction, for setting the respective drain electrodes of the respective second MOS transistors of said first charge transfer positive feedback amplifier circuit and said second charge transfer positive feedback amplifier circuit to an appropriate predetermined potential in said precharge period, and for releasing the predetermined potential set by said second means in said amplification period;

said input circuit including a mechanism for selectably altering one of the respective gate/source voltages of the respective first MOS transistors of said first charge transfer positive feedback amplifier circuit and said second charge transfer positive feedback amplifier circuit and the respective gate/source voltages of the respective second MOS transistors of said first charge transfer positive feedback amplifier circuit and said second charge transfer positive feedback amplifier circuit, in response to an input signal, the voltage of which changes, in said amplification period.

15. An amplifier assembly, comprising:

a charge transfer positive feedback amplifier circuit comprising:

a first MOS transistor, a second MOS transistor, which is of the opposite conductivity type to said first MOS transistor, a storage capacity, which is connected between the source electrode of said first MOS transistor and the source electrode of said second MOS transistor, a means for setting both terminals of said storage capacity to an appropriate predetermined potential in a reset period, a means for connecting the gate electrode of said second MOS transistor and the drain electrode of said first MOS transistor, and a first means for setting the drain electrode of said first MOS transistor to an appropriate predetermined potential in a precharge period which follows the reset period, and for releasing the predetermined potential set by said first means in an amplification period following said precharge period, and a means for connecting the gate electrode of said first MOS transistor and the drain electrode of said second MOS transistor, and a second means for setting the drain electrode of said second MOS transistor to an appropriate predetermined potential in said precharge period, and for releasing the predetermined potential set by said second means in said amplification period; and a mechanism for selectably altering one of the gate/source voltage of said first MOS transistor and the gate/source voltage of said second MOS transistor in response to an input signal, the voltage of which changes, in said amplification period;

said mechanism comprising at least one selectively accessible data memory element.

16. An amplifier assembly, comprising:

a circuit assembly including a first charge transfer positive feedback amplifier circuit and a second charge transfer positive feedback amplifier circuit;

each respective one of said first charge transfer positive feedback amplifier circuit and said second charge transfer positive feedback amplifier circuit respectively comprising:

a first MOS transistor, a second MOS transistor, which is of the opposite conductivity type to said first MOS transistor, a storage capacity, which is connected between the source electrode of said first MOS transistor and the source electrode of said second MOS transistor, a means for setting both terminals of said storage capacity to an appropriate predetermined potential in a reset period, a means for connecting the gate electrode of said second MOS transistor and the drain electrode of said first MOS transistor, and a first means for setting the drain electrode of said first MOS transistor to an appropriate predetermined potential in a precharge period which follows the reset period, and for releasing the predetermined potential set by said first means in an amplification period following said precharge period, and a means for connecting the gate electrode of said first MOS transistor and the drain electrode of said second MOS transistor, and a second means for setting the drain electrode of said second MOS transistor to an appropriate predetermined potential in said precharge period, and for releasing the predetermined potential set by said second means in said amplification period;

the first MOS transistor of said first charge transfer positive feedback amplifier circuit including a P-type MOS transistor, and the first MOS transistor of said second charge transfer positive feedback amplifier circuit including an N-type MOS transistor;

wherein the drain electrode of the P-type MOS transistor of said first charge transfer positive feedback amplifier circuit and the drain electrode of the N-type MOS transistor of said second charge transfer positive feedback amplifier circuit are connected, and the drain electrode of the N-type MOS transistor of said first charge transfer positive feedback amplifier circuit and the drain electrode of the P-type MOS transistor of said second charge transfer positive feedback amplifier circuit are connected; and a mechanism for selectably altering one of the respective gate/source voltages of the respective first MOS transistors of said first charge transfer positive feedback amplifier circuit and said second charge transfer positive feedback amplifier circuit and the respective gate/source voltages of the respective second MOS transistors of said first charge transfer positive feedback amplifier circuit and said second charge transfer positive feedback amplifier circuit, in response to an input signal, the voltage of which changes, in said amplification period;

said mechanism comprising at least one selectively accessible data memory element.

* * * * *